(12) United States Patent
Yoshida et al.

(10) Patent No.: US 7,857,952 B2
(45) Date of Patent: Dec. 28, 2010

(54) METHOD FOR TREATING THE SURFACE OF OBJECT AND APPARATUS THEREOF

(75) Inventors: Hideo Yoshida, 5-33-6, Kumegawa-machi, Higashimurayama, Tokyo (JP); Seizo Miyata, Nishitokyo (JP); Masato Sone, Koganei (JP); Nobuyoshi Sato, Osaka (JP)

(73) Assignees: Hideo Yoshida, Tokyo (JP); Asahi Engineering Co., Ltd., Osaka (JP)

( * ) Notice: Subject to any disclaimer, the term of this patent is extended or adjusted under 35 U.S.C. 154(b) by 287 days.

(21) Appl. No.: 11/981,136

(22) Filed: Oct. 31, 2007

(65) Prior Publication Data

US 2008/0210554 A1  Sep. 4, 2008

Related U.S. Application Data

(62) Division of application No. 10/416,678, filed as application No. PCT/JP02/11203 on Oct. 29, 2002, now Pat. No. 7,323,096.

(30) Foreign Application Priority Data

Nov. 14, 2001 (JP) ............................. 2001-348787
Jul. 31, 2002 (JP) ............................. 2002-223712

(51) Int. Cl.
 *C25D 17/06* (2006.01)
(52) U.S. Cl. ................. 204/273; 204/242; 118/429; 220/319; 277/644
(58) Field of Classification Search ................. None
See application file for complete search history.

(56) References Cited

U.S. PATENT DOCUMENTS

| | | | | |
|---|---|---|---|---|
| 3,070,254 A | * | 12/1962 | Carse et al. ................ | 220/319 |
| 3,246,793 A | * | 4/1966 | Wade ........................ | 220/321 |
| 3,652,431 A | * | 3/1972 | Reynolds .................... | 205/338 |
| 3,990,605 A | * | 11/1976 | Hanke et al. ................ | 220/316 |
| 4,303,177 A | * | 12/1981 | Amtmann .................... | 220/323 |
| 4,444,331 A | * | 4/1984 | Lankston .................... | 220/304 |
| 4,936,483 A | * | 6/1990 | Ballu ........................ | 220/240 |
| 4,963,423 A | * | 10/1990 | Sekiguchi et al. ........... | 428/209 |
| 5,762,227 A | * | 6/1998 | Mitchell .................... | 220/321 |
| 6,585,882 B1 | * | 7/2003 | Su et al. .................... | 205/687 |
| 6,793,793 B2 | * | 9/2004 | Yoshida et al. .............. | 205/88 |
| 2002/0157964 A1 | * | 10/2002 | Hoffman et al. ............ | 205/670 |
| 2003/0019756 A1 | * | 1/2003 | Yoshida et al. .............. | 205/88 |

FOREIGN PATENT DOCUMENTS

| | | |
|---|---|---|
| JP | 02-043399 | 2/1990 |
| JP | 7-6267 | 1/1995 |
| JP | 10-036999 | 2/1998 |
| JP | 11-87306 | 3/1999 |
| WO | WO 02/16673 | 2/2002 |
| WO | WO 02/16673 A1 * | 2/2002 |

* cited by examiner

*Primary Examiner*—Harry D Wilkins, III
(74) *Attorney, Agent, or Firm*—Jordan and Hamburg LLP

(57) ABSTRACT

An apparatus for treating the surface of an object to be treated comprising introducing a surface treatment fluid into a reaction vessel (4) capable of receiving an object, introducing the surface treatment fluid into a separation vessel (14) after the object is subjected to surface treatment, and circulating the surface treatment fluid, from which a contaminant has already been removed, to the reaction vessel (4). At the time of treatment on the surface of the object, a circulation passage for the surface treatment fluid including the reaction vessel (4) is communicated and the surface treatment fluid is constantly circulated through the circulation passage.

7 Claims, 9 Drawing Sheets

METHOD FOR TREATING THE SURFACE OF OBJECT AND APPARATUS THEREOF

This is a divisional application of Ser. No. 10/416,678, now allowed, filed May 14, 2003, which is in turn is the 35 U.S.C 371 National Stage Application of PCT/JP02/11203 filed on Oct. 29, 2002, claiming priorities of Japanese Patent Application No. 2001-348787 which was filed on Nov. 14, 2001, and Japanese Patent Application No. 2002-223712, which was filed Jul. 31, 2002. The subject matter of the aforementioned prior applications is hereby incorporated herein by reference.

TECHNICAL FIELD

The present invention relates to a method for treating the surface of an object to be treated and an apparatus thereof, suitably applied, for example, to electrochemical treatment on an object to be treated, capable of avoiding contact between the object and the atmosphere, uniformly activating the surface of the object with precision, obtaining a good precipitation of metal ion, rationally carrying out the supply and discharge of the surface treatment fluid and the treatment solution, attaining effective utilization thereof and prohibiting the discharge of the same to the outside of the system, realizing a reasonable system, enhancing productivity and achieving mass production, rationally and safely carrying out the electrochemical treatment operation, miniaturizing the equipment and achieving the cost reduction, and providing a convenient maintenance.

BACKGROUND ART

For example, the conventional electroplating process can be classified into three processes, e.g., a prior treatment process, a plating process and a post treatment process. Of those processes, the prior treatment process includes a degreasing and cleaning treatment and an acid pickling process. The prior process is normally carried out in the following manner. A predetermined treatment solution is received in a specific bath vessel and heated. Then, an object to be treated is dipped in this treatment solution for a predetermined time.

Accordingly, a plurality of bath vessels and a working space large enough for them are required. This naturally increases the equipment cost. At the same time, workers are obliged to work under such an inferior working circumstance that the treatment solution is diffused and a toxic gas is generated. Moreover, a long time is required for dipping the object into the treatment solution and thus, productivity is decreased.

As one attempt to solve those problems, the present applicant has developed an electrochemical treatment method in which a supercritical substance, an electrolytic solution and a surface active agent are introduced into a reaction bath vessel, then they are subjected to electroplating treatment in an emulsion state, and thereafter, the supercritical substance is evaporated and discharged to the outside of the bath vessel. By doing so, the reaction bath vessel, the electrodes, etc. can be cleaned without a need of a cleaning solution. This method has already been filed by the present applicant under the Japanese Patent Application No. 2000-253572.

However, this conventional method has the following problems. Since a reaction bath vessel of a high-pressure container is used as a plating vessel, the object, the electrolytic solution and the supercritical substance are received in this vessel and the electrolytic solution and the supercritical substance are agitated in the vessel, a space for agitation and an apparatus for agitation is required, the reaction bath vessel becomes large and heavy and thus expensive.

In the first-mentioned conventional method and in a method of Japanese Patent Application Laid-Open No. H11-87300, as means for agitating a supercritical fluid and a chemical solution introduced into the reaction bath vessel, the reaction bath vessel is provided at the inside thereof with an agitating blade and a rotating mechanism of a substrate, or an oscillating mechanism and an ultrasonic vibrator, so that the reaction bath vessel is oscillated or vibrated.

However, the agitating blade and the rotating mechanism inevitably increase the reaction bath vessel in size and weight and thus expensive. The oscillating mechanism makes the apparatus large scaled and in addition, mechanical trouble is more likely to occur than ever. The ultrasonic vibrator is expensive and actual effectiveness of agitation is not very sure.

It is, therefore, a primary object of the present invention to provide, in order to solve the above problems and further improve the previously-mentioned electrochemical treatment method and an apparatus thereof, a method for treating the surface of an object to be treated and a treating apparatus thereof, which is suitably applied, for example, to a electrochemical treatment of the object.

Another object of the present invention is to provide a method for treating the surface of an object to be treated and a treating apparatus thereof, which is capable of avoiding contact between the object and the atmosphere, uniformly activating the surface of the object with precision, and obtaining a good precipitation of metal ion.

A further object of the present invention is to provide an a method for treating the surface of an object to be treated and a treating apparatus thereof, which is capable of rationally carrying out the supply and discharge of the surface treatment fluid and the treatment solution, attaining effective utilization thereof and prohibiting the discharge of the same to the outside of the system, realizing a reasonable system, and enhancing productivity and achieving mass production.

A still further object of the present invention is to provide an a method for treating the surface of an object to be treated and a treating apparatus thereof, which is capable of rationally and safely carrying out the electrochemical treatment operation, miniaturizing the equipment and achieving the cost reduction, and providing a convenient maintenance.

A yet further object of the present invention is to provide an a method for treating the surface of an object to be treated and a treating apparatus thereof, which is capable of omitting the installation of an agitating device in a reaction vessel, miniaturizing the equipment and achieving the cost reduction thereof.

An additional object of the present invention is to provide an a method for treating the surface of an object to be treated and a treating apparatus thereof, which is capable of carrying out the agitation of various surface treatment fluids in the reaction vessel with precision, favorably and rationally carrying out various surface treatments with respect to the object, uniformly supplying ion and obtaining a good finishing of plating.

DISCLOSURE OF THE INVENTION

A method for treating the surface of an object to be treated according to the present invention comprises introducing a surface treatment fluid into a reaction vessel capable of receiving an object, introducing the surface treatment fluid into a separation vessel after the object is subjected to surface treatment, and circulating the surface treatment fluid, from which a contaminant has already been removed, to the reaction vessel, wherein at the time of treatment on the surface of the object, a circulation passage for the surface treatment fluid including the reaction vessel is communicated and the surface treatment fluid is constantly circulated through the circulation passage. Accordingly, the surface treatment, for example, degreasing and cleaning treatment and drying treatment, of the object by using the surface treatment fluid can be carried out with precision and rapidly when compared with the surface treatment method in which the surface treatment is carried out by allowing the surface treatment fluid to stay in the reaction vessel.

Since it can avoid the contact of the object to be plated with the atmosphere, the activating treatment, for example, on the surface of the object can be carried out with precision and surely. This invention is suited to be applied to the multi-layer lap plating.

Moreover, in a method for treating the surface of an object to be treated according to the present invention, the surface treatment fluid is constantly circulated at the time of degreasing, cleaning or drying the object. Accordingly, the surface activating treatment such as degreasing, cleaning or drying treatment can be carried out on the object with precision and surely.

Moreover, in a method for treating the surface of an object to be treated according to the present invention, gas generated by electrochemical reaction in the surface treatment fluid is separated or removed after the object is subjected to surface treatment. Accordingly, since the gas can be prevented from being mixed in the system, a good electrochemical reaction can be obtained with respect to the object, and the surface treatment fluid can be reproduced with precision.

In a method for treating the surface of an object to be treated according to the present invention, oxygen and hydrogen in the surface treatment fluid are separated or removed after the object is subjected to surface treatment. Accordingly, since the oxygen and hydrogen generated by electrochemical reaction can be prevented from being mixed in the system, a good electrochemical reaction can be obtained with respect to the object, and the surface treatment fluid can be reproduced with precision.

Moreover, in a method for treating the surface of an object to be treated according to the present invention, oxygen and hydrogen generated in the surface treatment fluid by electrochemical reaction after the object is subjected to surface treatment are combusted to generate water, and the surface treatment fluid, from which the water has already been removed, is circulated through the circulation passage. Since the oxygen and hydrogen can be removed safely and easily, the disadvantage caused by the water being mixed in the system can be prevented from occurring, and the drying treatment by using the surface treatment fluid can be carried out smoothly and efficiently.

Moreover, in a method for treating the surface of an object to be treated according to the present invention, a supply/discharge passage of the reaction vessel is shut off after the surface treatment fluid and an acid pickling solution or electrolytic solution are introduced into the reaction vessel, and the object is subjected to acid pickling treatment or electrochemical reaction. Accordingly, since the acid pickling solution and the electrolytic solution can be prevented from moving and flowing in the circulation passage, the acid pickling treatment and electrochemical reaction can be carried out stably, the circulation passage can be prevented from corrosion and the system can be prevented from getting trouble.

In a method for treating the surface of an object to be treated according to the present invention, the surface treatment fluid in the reaction vessel is circulated to the circulation passage after the object is subjected to acid pickling treatment or electrochemical reaction, and the acid pickling solution or electrochemical solution is separated from the circulation passage for the surface treatment fluid. Since the surface treatment fluid, the acid pickling solution, the electrolytic solution, etc. can be treated separately, they can be treated rationally and safely, and they can be reproduced.

Moreover, in a method for treating the surface of an object to be treated according to the present invention, the surface treatment fluid in the acid pickling solution or electrolytic solution is separated after the object is subjected to acid pickling treatment or electrochemical reaction, and returned to the circulation passage for the surface treatment fluid. Accordingly, the surface treatment solution mixed in the acid pickling solution and electrolytic solution at the time of acid pickling or electrochemical reaction can be effectively utilized.

Moreover, in a method for treating the surface of an object to be treated according to the present invention, the surface treatment fluid is a pressurized fluid which is equal to or more than the atmospheric pressure, or supercritical or subcritical fluid. Accordingly, in case the pressurized fluid is equal to or more than the atmospheric pressure, the surface treatment fluid can easily be obtained, and the system can be manufactured at a low cost and driven safely. In case the pressurized fluid is a supercritical or subcritical fluid, a good surface treatment state can be obtained by its high dispersibility.

An apparatus for treating the surface of an object to be treated according to the present invention comprises a reaction vessel for receiving therein an object to be treated, the reaction vessel being capable of introducing the surface treatment fluid therein and capable of being hermetically closed, and a separation vessel for allowing the surface treatment fluid, which has already been subjected to surface treatment, to be transferred thereto from the reaction vessel and capable of separating a contaminant in the surface treatment fluid, the surface treatment fluid, from which the contaminant has already been separated, being capable of circulating to the reaction vessel, wherein a circulation passage including the reaction vessel for the surface treatment fluid is communicated at the time of treating the surface of the object, so that the surface treatment fluid can constantly circulate through the circulation passage. Accordingly, the surface treatment, for example, degreasing and cleaning treatment and drying treatment, of the object by using the surface treatment fluid can be carried out with precision and rapidly when compared with the surface treatment method in which the surface treatment is carried out by allowing the surface treatment fluid to stay in the reaction vessel. Since it can avoid the contact of the object to be plated with the atmosphere, the activating treatment on the surface of the object can be carried out with precision and surely and a good precipitation, for example, of metal ion can be obtained. This invention is suited to be applied to the electroplating and the multi-layer lap plating.

Moreover, since the receiving vessel for receiving therein the surface treatment fluid and treatment solution after used is substantially eliminated, the equipment can be made compact and at a low cost. In addition, the surface treatment fluid can be reproduced rapidly.

Moreover, in an apparatus for treating the surface of an object to be treated according to the present invention, the surface treatment fluid can constantly circulate at the time of degreasing, cleaning or drying the object. Accordingly, the surface activating treatment, such as the degreasing, cleaning or drying can be carried out on the object with precision and rapidly.

Moreover, in an apparatus for treating the surface of an object to be treated according to the present invention, gas generated in the surface treatment fluid by electrochemical reaction can be separated or removed. Accordingly, since the gas can be prevented from being mixed in the system, a good electrochemical reaction can be obtained with respect to the object, and the surface treatment fluid can be reproduced with precision.

Moreover, in an apparatus for treating the surface of an object to be treated according to the present invention, a reaction vessel capable of separating or removing oxygen and hydrogen contained in the surface treatment fluid is inserted in the circulation passage. Accordingly, the mixing of the oxygen and hydrogen into the system and the disadvantage resulting therefrom can be prevented, and the surface treatment fluid can be reproduced with precision.

In an apparatus for treating the surface of an object to be treated according to the present invention, a dewatering apparatus capable of separating water is inserted in the circulation passage on the downstream side of the reaction vessel. Accordingly, the oxygen and hydrogen can be removed safely and easily, the disadvantage caused by the oxygen, hydrogen and water mixed in the system can be prevented from occurring, and the drying by using the surface treatment fluid can be carried out smoothly and efficiently.

Moreover, in an apparatus for treating the surface of an object to be treated according to the present invention, the surface treatment fluid and acid pickling solution or electrolytic solution can be introduced into the reaction vessel, and after they are introduced in the reaction vessel, a supply/discharge passage of the reaction vessel can be shut off. Accordingly, since the acid pickling solution and the electrolytic solution can be prevented from moving and flowing in the circulation passage, the acid pickling treatment and electrochemical reaction can be carried out stably, the circulation passage can be prevented from corrosion and the system can be prevented from getting trouble.

Moreover, in an apparatus for treating the surface of an object to be treated according to the present invention, the surface treatment fluid in the reaction vessel can be circulated through the circulation passage after the object is subjected to acid pickling or electrochemical reaction treatment, and the acid pickling solution or electrolytic solution can be separated from the circulation passage for the surface treatment fluid. Since the surface treatment fluid, the acid pickling solution and the electrolytic solution can be treated separately, they can be treated rationally and safely, and they can be reproduced.

Moreover, in an apparatus for treating the surface of an object to be treated according to the present invention, a treatment solution recovering vessel capable of separating the surface treatment fluid contained in the acid pickling solution or electrolytic solution is inserted in a discharge passage of the reaction vessel, and the recovering vessel is communicated with the circulation passage for the surface treatment fluid. Accordingly, the surface treatment solution mixed in the acid pickling solution and electrolytic solution at the time of acid pickling or electrochemical reaction can be effectively utilized.

In an apparatus for treating the surface of an object to be treated according to the present invention, the surface treatment fluid is a pressurized fluid equal to or higher than the atmospheric pressure, or supercritical or subcritical fluid. Accordingly, in case the pressurized fluid is equal to or more than the atmospheric pressure, the surface treatment fluid can easily be obtained, and the system can be manufactured at a low cost and driven safely. In case the pressurized fluid is a supercritical or subcritical fluid, a good surface treatment state can be obtained by its high dispersibility.

Moreover, in an apparatus for treating the surface of an object to be treated according to the present invention, a plurality of the reaction vessels are provided, the reaction vessels are communicated with the circulation passage, a pressurized fluid equal to or higher than the atmospheric pressure, or a supercritical or subcritical fluid and an acid pickling solution or electrolytic solution are sequentially introduced into the reaction vessels, degreasing/cleaning treatment, acid pickling treatment, drying treatment, electric plating treatment and drying treatment are sequentially carried out with respect to the object in each of the reaction vessels, every adjacent reaction vessels are communicated so that the fluid used can be supplied/discharged, and in the reaction vessels in which preceding and succeeding treatments are carried out, after the preceding reaction vessel is subjected to treatment, the fluid used can be supplied to the succeeding reaction vessel. By sequentially using the surface treatment fluid used, the acid pickling solution used, etc. in the respective reaction vessels, they can be effectively utilized, the surface treatment on the object and the various treatment processes can be carried out rationally and on a mass production basis.

Moreover, an apparatus for treating the surface of an object to be treated according to the present invention comprises a vessel main body receiving therein a jig to the interior of which the object can be attached and an agitator means, and capable of supplying/discharging the surface treatment fluid of the object, and a lid member capable of hermetically closing the main body, wherein only one or a plurality of the jigs are detachably attached to the lid member. Since the lid member and the jigs are integrated, they can be handled conveniently. In addition, the maintenance of the jigs, the lid member and the vessel main body can be carried out easily.

Moreover, in an apparatus for treating the surface of an object to be treated according to the present invention, the lid member and the jig are capable of being lifted up and down integrally. Accordingly, they can be brought into and out of the vessel main body easily and rapidly.

Moreover, in an apparatus for treating the surface of an object to be treated according to the present invention, a cross-sectional configuration of a chamber of the vessel main body and a cross-sectional configuration of the jig have a mutually similar shape, and the chamber and jig are arranged concentrically. Accordingly, the vessel main body and the jig can be manufactured rationally and made compact. In addition, a plurality of objects to be treated can be received and treated therein efficiently, and they can be treated on a mass production basis.

Moreover, in an apparatus for treating the surface of an object to be treated according to the present invention, the cross-sectional configuration of the chamber of the vessel main body and the cross-sectional configuration of the jig are each formed in a circular shape, and the chamber and jig are arranged concentrically. Accordingly, a plurality of objects to be treated can be received and treated therein efficiently, and they can be treated on a mass production basis. In addition, the surface treatment fluid and the solution used, etc. can be agitated with precision.

Moreover, in an apparatus for treating the surface of an object to be treated according to the present invention, the jig is partitioned into plural sections and those partitioned sections are rotatably connected together. Accordingly, the jig can be opened and closed easily, and the object to be treated can be attached to and detached from the jig easily.

Moreover, in an apparatus for treating the surface of an object to be treated according to the present invention, electrodes capable of energizing the jig are attached to the lid member. Accordingly, the lid member, the jig and the electrodes can be integrated, and they can be handled conveniently. In addition, their maintenance can be carried out easily.

Moreover, in an apparatus for treating the surface of an object to be treated according to the present invention, the same potential is impressed upon the jigs which are arranged in mutually adjacent manner. Accordingly, the electrochemical reaction such as electroplating can be carried out uniformly with respect to the object which is mounted on each jig. Thus, a uniform electrochemical reaction such as electroplating can be obtained with respect to each object.

Moreover, in an apparatus for treating the surface of an object to be treated according to the present invention, the electrode is arranged at the center of the chamber. By uniformly setting the electric field strength of each jig, a uniform electrochemical reaction such as electroplating can be obtained with respect to each object.

In an apparatus for treating the surface of an object to be treated according to the present invention, an agitation shaft capable of rotating the agitator means is arranged at the center of the lid member, and the electrode is coaxially arranged on the outer side of the agitation shaft. Accordingly, Since the lid member, the jig and the electrode can be integrated, they can be handled easily and their maintenance can be carried out easily.

Moreover, in an apparatus for treating the surface of an object to be treated according to the present invention, a pressurized fluid higher than the atmospheric pressure, or a supercritical or subcritical fluid, an acid pickling fluid and an electrolytic solution are introduced into the reaction vessel in a sequential manner so that degreasing treatment, acid pickling treatment, drying treatment and electroplating can be carried out with respect to the object in a sequential manner. Accordingly, by communicating the mutually adjacent reaction vessels, the fluid used can be supplied and discharged therethrough. Moreover, after the treatment in the preceding reaction vessel, the fluid used can be supplied to the following reaction vessel. Thus, by sequentially using the surface treatment fluid used and the acid pickling solution used in each reaction vessel, they can be utilized effectively. In addition, the surface treatment and the respective treatment processes can be carried out rationally with respect to the object and they can be carried out on a mass production basis.

Moreover, in an apparatus for treating the surface of an object to be treated according to the present invention, the electrode is composed of an insoluble member, and a supercritical or subcritical solution and an electrolytic solution are introduced into the reaction vessel so that electroplating can be carried out with respect to the object. Accordingly, metal ion can favorably and uniformly be carried out with respect to the object under the supercritical or subcritical fluid having a high dispersibility. In addition, consumption of the electrode can be eliminated, no interruption occurs due to replacement of the electrode, etc., and productivity of the electrochemical reaction is enhanced.

In an apparatus for treating the surface of an object to be treated according to the present invention, in which a surface treatment fluid is introduced into a reaction vessel so that the object can be subjected to surface treatment, wherein the surface treatment fluid can be ejected to at least one side of the object. Accordingly, the surface treatment can be carried out with precision and rapidly with respect to the object.

Accordingly, if the surface treatment fluid is simultaneously ejected to the front and back surface of the object, the surface treatment can be carried out with precision and rapidly with respect to the object.

Moreover, in an apparatus for treating the surface of an object to be treated according to the present invention, the reaction vessel is provided at the outside thereof with chambers, the same or different kind of surface treatment fluid is introduced into the chambers and dispersed or agitated, and the dispersed or agitated fluid is introduced into the reaction vessel which is faced with at least one side of the object. Accordingly, the surface treatment can be carried out by the various dispersed or agitated fluids.

Moreover, in an apparatus for treating the surface of an object to be treated according to the present invention, the surface treatment fluid is a supercritical or subcritical fluid, or an acid pickling solution or electrolytic solution. Accordingly, the various treatments such as degreasing and cleaning, acid pickling or oxide film removal, plating and drying can be carried out by those fluids. Thus, this invention is suitably applicable to a sequence of processes of plating treatment.

In an apparatus for treating the surface of an object to be treated according to the present invention, a supercritical or subcritical fluid, an electrolytic solution and a surface active agent are introduced into the chambers, dispersed or agitated, and an emulsion fluid generated by the dispersion or agitation is introduced into the reaction vessel. Accordingly, the dispersibility of each surface treatment fluid is enhanced on the basis of the supercritical or subcritical fluid, and the working efficiency of the acid pickling, oxide film removal, plating treatment, etc is enhanced. In addition, since the energy of the surface is lowered by emulsion state, dewatering is enhanced so that drying can be carried out rapidly. In addition, the surface treatment such as plating can be enhanced in quality.

Moreover, in an apparatus for treating the surface of an object to be treated according to the present invention, a plurality of the chambers are provided, a supercritical or subcritical fluid is introduced into each chamber, an acid pickling solution or electrolytic solution is introduced into a part of the chambers and dispersed or agitated together with the supercritical or subcritical solution, and the dispersed or agitated fluid is introduced into the reaction vessel. Accordingly, by preparing an acid pickling solution or electrolytic solution based on the supercritical or subcritical fluid, the working efficiency of the acid pickling, oxide film removal, plating treatment, etc is enhanced. In addition, a good finishing of plating can be obtained.

Moreover, in an apparatus for treating the surface of an object to be treated according to the present invention, a transmission member for allowing the surface treatment fluid to transmit therethrough is arranged between at least one side of the object and the reaction vessel confronting the object. Accordingly, by ejecting the surface treatment fluid toward the transmission member, the surface treatment fluid is smoothly atomized, accurately dispersed or agitated, thereby enabling to carry out the dispersion of the acid pickling solution, the electrolytic solution, etc., or the agitation of the agitation fluid. Moreover, by eliminating the installation of the agitator in the reaction vessel, the reaction vessel can be made small in size and light in weight, and manufactured easily and at a low cost.

Accordingly, if the transmission members are arranged on both sides of the object, and between the reaction vessels in such a manner as to oppose to the object, atomization of the surface treatment fluid and dispersion or agitation thereof can be enhanced, and the surface treatment of the object can be carried out accurately and rapidly.

In an apparatus for treating the surface of an object to be treated according to the present invention, the transmission member is formed into an electrode which can be energized. Accordingly, by rendering such functions as an electrode, for example, an anode, and agitation, the plating vessel can be simplified in construction and the plating treatment can be rationalized.

Moreover, in an apparatus for treating the surface of an object to be treated according to the present invention, the transmission members are arranged on an upper and a lower side of the object, and the surface treatment fluid is ejected toward the object from the outer side of the transmission members generally in the same quantity and at the same speed.

Accordingly, the surface treatment fluid can be agitated accurately and uniformly, and the surface of the object can be treated accurately and rapidly. In addition, by uniformly distributing the electric field, a good finishing of plating can be enhanced.

The above objects, features and advantages of the present invention will become more manifest from the following detailed description with reference to the accompanying drawings.

BEST MODE FOR CARRYING OUT THE INVENTION

Figure 1:
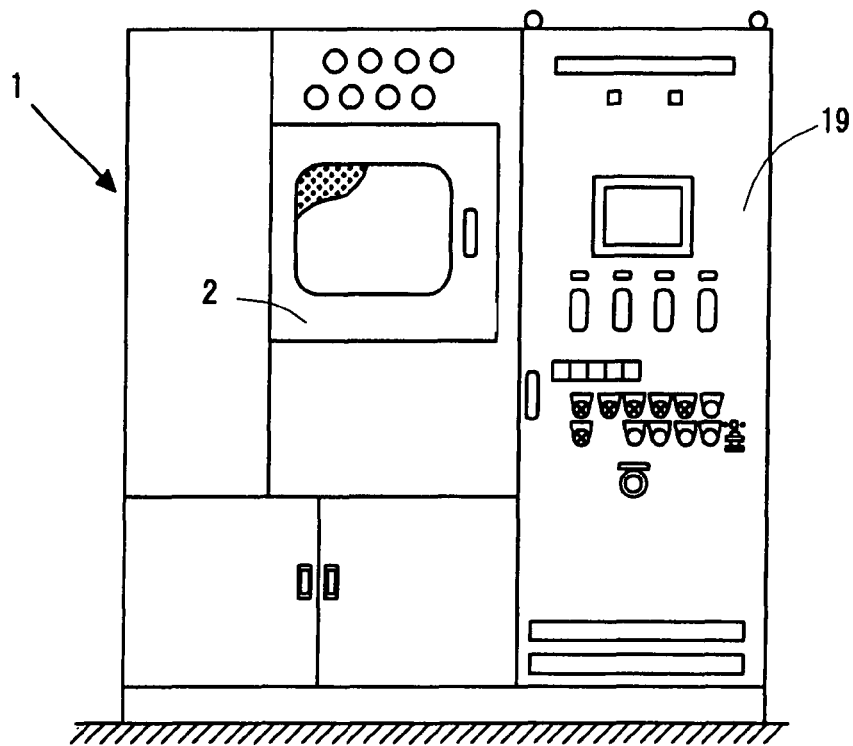
FIG. 1 is a front view showing the outer appearance of an installation state of an apparatus according to the present invention.
Figure 2:
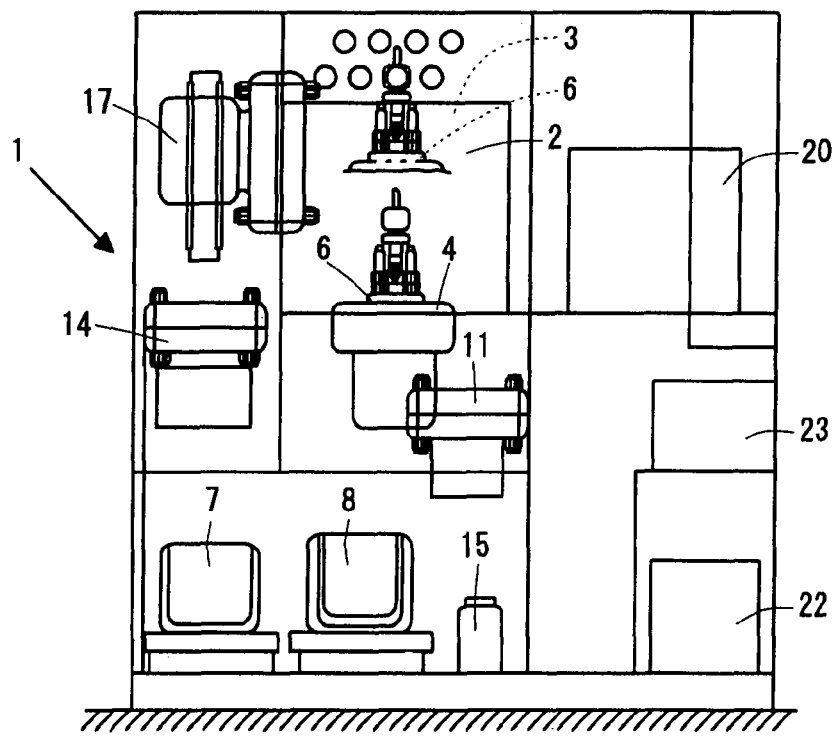
FIG. 2 is a front view showing a state of the interior of the apparatus according to the present invention.

The illustrated embodiments will be described hereinafter, in which the present invention is applied to an electroplating (nickel plating) as an electrochemical treatment method utilizing a supercritical or subcritical fluid. In FIGS. 1 through 9, reference numeral 1 denotes a box-shaped treatment apparatus installed in a working chamber. The box-shaped treatment apparatus 1 is provided at a middle high position of its front surface with a door 2 which can be opened and closed and at a lower part in a treatment chamber 3, which is faced with the door 2, with a pressure resisting reaction vessel 4.

The reaction vessel 4 is opened upward. An object receiving container 5 as a jig to which an object to be plated, etc. can removably be mounted, and electrodes, etc. are received in the reaction vessel 4. The reaction vessel 4 is hermetically closed with a lid member 6. The lid member 6 is locked through a clamp ring as will be described later. After completion of the work, the contents such as the jig, etc. can be taken out integrally.

A first and a second treatment solution vessel 7, 8 capable of receiving therein different kinds of plating solutions are arranged, in side-by-side relation, immediately under the reaction vessel 4. Owing to this arrangement, those solutions can selectively be supplied to the reaction vessel 4 through liquid feed pumps 9, 10.

A pressure resisting treatment solution recovery vessel 11 is disposed at a location immediately under a rear part of the reaction vessel 4. This treatment solution recovery vessel 11 has generally the same capacity and pressure resisting capability. The treatment solution in the reaction vessel 4 is flowed down by gravity action after treatment and heated so that carbon dioxide and the treatment solution can be separated.

The reaction vessel 4 and the treatment solution recovery vessel 11 are connected to each other through a treatment solution discharge pipe 12. A treatment solution discharge valve 13 is inserted in this pipe 12. The discharge valve 13 is opened at the time of introduction of a supercritical or subcritical solution into the reaction vessel 4 and at the time of degreasing and cleaning treatment and drying treatment in the reaction vessel 4. The discharge valve 13 is closed at the time of acid pickling treatment and plating treatment in the reaction vessel 4.

A pressure resisting separation vessel 14 is disposed on the downstream side of the reaction vessel 4. This separation vessel 14 is construction in the same shape and same manner as the treatment solution recovery vessel 11. In the separation vessel 14, the oil and fat part contained in the treatment gas is separated and removed through pressure reduction and heating action.

In the illustration, reference numeral 15 denotes an acid pickling solution receiving tank for receiving therein an acid pickling solution for removing an oxide film. The acid pickling solution can be supplied to the reaction vessel 4 from this tank 15. Reference numeral 16 denotes a pressure pump which is arranged in side-by-side relation with the liquid feed pumps 9, 10. By this pumps 9, 10, the carbon dioxide as a supercritical or subcritical state generating fluid is pressurized to 0.5 or more in density so that the carbon dioxide is made into a liquid or gas state, or a supercritical or subcritical state.

In the illustration, reference numeral 17 denotes a condensing and recovering vessel disposed at a rear part in the treatment apparatus 1. This condensing and recovering vessel 17 is communicated with a refrigerator 18 which is disposed immediately thereunder, through a refrigerant pipe, so that the carbon dioxide as a supercritical or subcritical fluid introduced into the vessel 17 can be cooled and liquefied.

Reference numeral 19 denotes a control disc which contains therein various electric devices; 20, a rectifier; 21, a relay box; 22, a transformer; 23, an oil vessel; and 24, a dewatering column as a dewatering apparatus, respectively.

Figure 6:
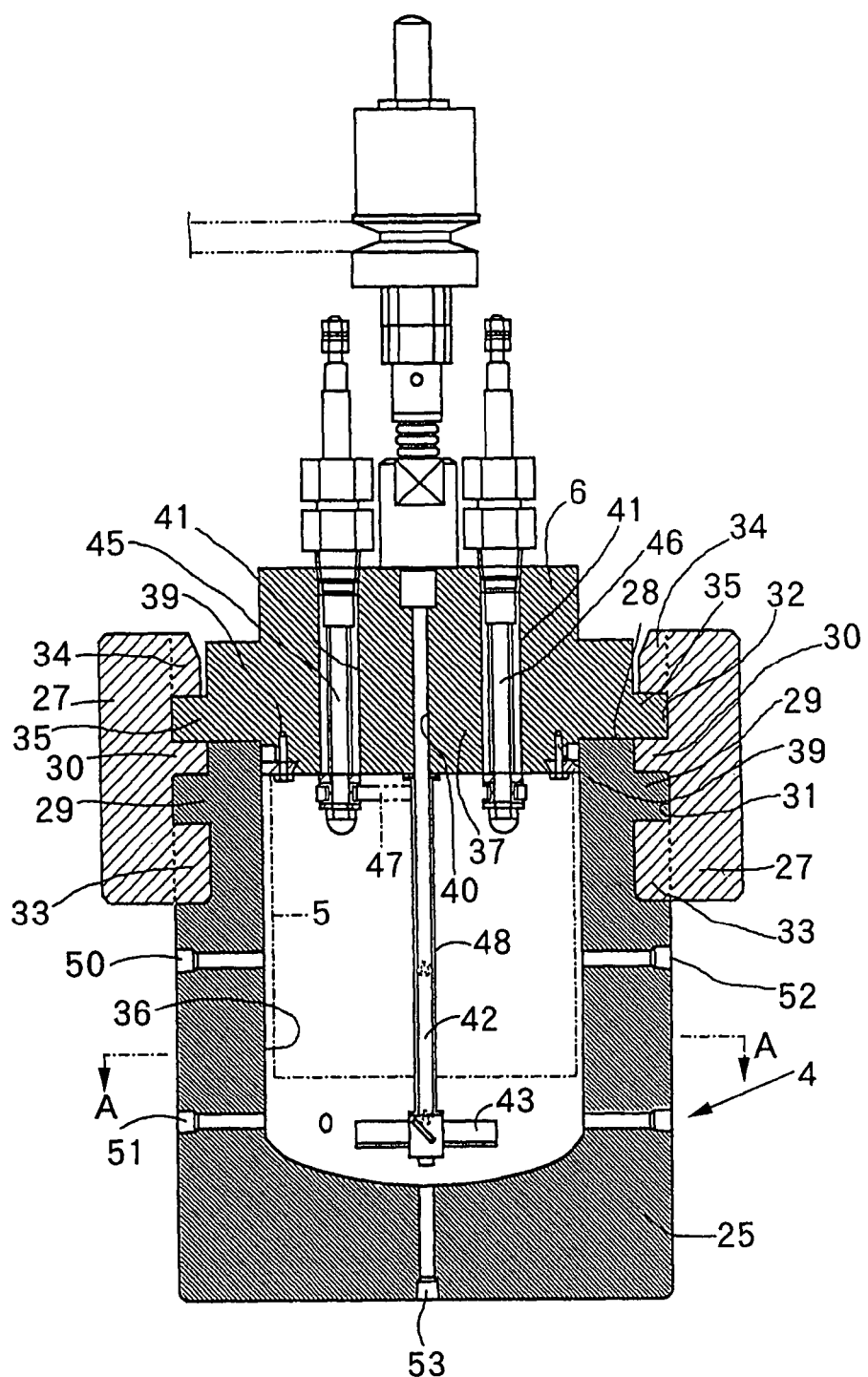
FIG. 6 is a sectional view showing, on an enlarged scale, a reaction vessel applied to the apparatus according to the present invention, in which a lid member with a jig attached thereto is mounted on the reaction vessel and they are locked by a clamp ring so as to be ready for electrochemical reaction of an object to be treated.
Figure 7:
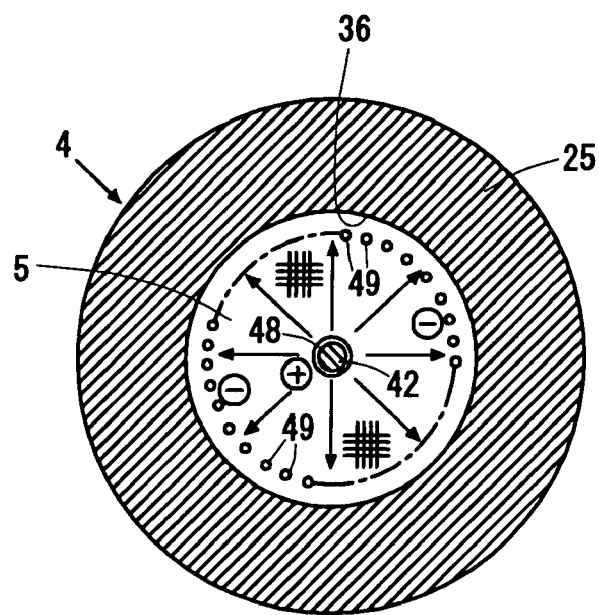
FIG. 7 is a sectional view taken on line A-A of FIG. 6 showing, on a slightly reduced scale, an energization state between the jig and electrodes in the reaction vessel.
Figure 8:
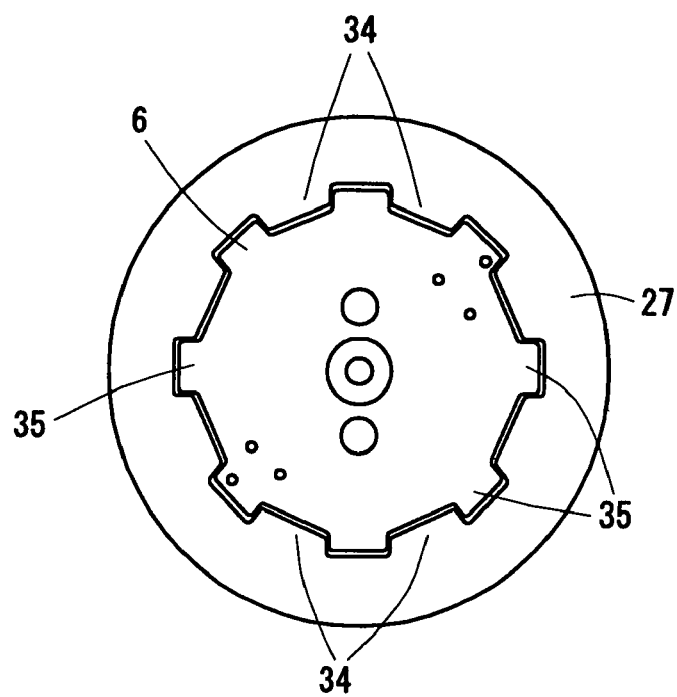
FIG. 8 is a plan view of a reaction vessel which is applied to the apparatus of the present invention, in which electrodes and a motor are omitted and showing an open state immediately before a lid member and a clamp ring are locked.
Figure 9:
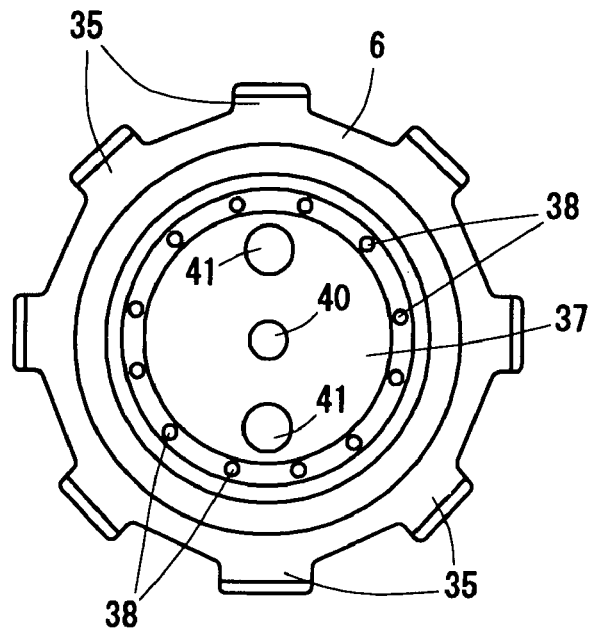
FIG. 9 is a bottom view of the lid member which is applied to the apparatus of the present invention.

The reaction vessel 5 comprises, as shown in FIGS. 6 through 8, a cylindrical vessel main body 25 having a bottom, a lid member 6 for hermetically closing the opening part of the main body 26, and a clamp ring 27 for retaining the closed state of the lid member 6. Those component elements 25, 26, 27 are formed of a stainless steel having a large thickness and their peripheral surface is lined for insulation with vinyl chloride and hard rubber.

The vessel main body 25 is provided at an outer peripheral surface of its upper part with a clamp seal part 28 having a reduced diameter. A plurality of tongue-shaped clamp pawls 29 are formed on a peripheral part of a middle high part of the seal part 28.

The clamp ring 27 is rotatably attached to the clamp seal part 28. The clamp ring 27 is provided at a middle high part of its inner peripheral surface with a ring-shaped lock part 30 which is to be engaged with the clamp pawl 29, and at upper and lower parts of the lock part 30 with annular grooves 31, 32.

The clamp pawl 29 is engaged with the annular groove 31. A plurality of tongue-shaped clamp pawls 33 are formed immediately under the groove 31 so that the clamp pawl 33 can engage the clamp pawls 29.

A clamp pawl of a lid member 6 as later described is engaged with the annular groove 32. A plurality of tongue-shaped clamp pawls 34 are formed immediately above the annular groove 32 so that the clamp pawl 34 can engage the clamp pawl of the lid member 6.

The lid member 6 is formed in a disc-shape having plural small and large steps. A plurality of clamp pawls 35 are formed on the peripheral surface of the largest diameter part of the lid member 35 so that the clamp pawls 35 can removably engage the clamp pawls 34. This allows the lid member 6 to be attached and detached.

A generally disc-shaped boss part 37, which is engageable with a chamber 36 of the reaction vessel 4, projects from a lower part of the lid member 6. A plurality of thread holes are formed in the peripheral surface of the boss part 37. By screwing bolts or screws into the thread holes 38, the object receiving vessel 5 is removably attached to the lid member 6.

The lid member 6 is provided at its central part and its both sides with small and large-sized through-holes 40, 41. An agitation shaft 42 is inserted in the through-hole 40 which is formed in the central part of the lid member 6. A fan 43 is attached to lower end part of the shaft 42, and a motor 44 is attached to an upper end part of the shaft 42.

Similar electrode rods 45, 46 are inserted in the large-sized through-holes 41, 41, and a positive electric potential and a negative electric potential are incurred to the electrodes 45, 46, respectively.

One end of a conductive member 47 such as carbon is attached to a lower end part of the electrode rod 45 to which a positive electric potential is incurred, and the other end is conductibly connected to the electrode tube 48 which is mounted on the peripheral surface of the agitation shaft 42.

The electrode tube 48 is composed of an insoluble electrode member such as carbon and ferrite so that it is non-elutable even if it is exposed to electrolytic solution and placed in the electric field.

One end of a conductive member (not shown) such as carbon is attached to a lower end part of the electrode rod 46 to which a negative electric potential is incurred, and the other end is conductibly connected to an upper end part of the object receiving container 5.

In the illustration, reference numeral 49 denotes a conductive framework which constitutes the object receiving container 5 and which allows the object to be hooked or clipped. Reference numeral 50 through 53 denote ports which are open at the outer surface of the vessel main body 25. The ports 50 through 53 are communicated with the chamber 36 and connected with a predetermined pipeline.

Figure 5:
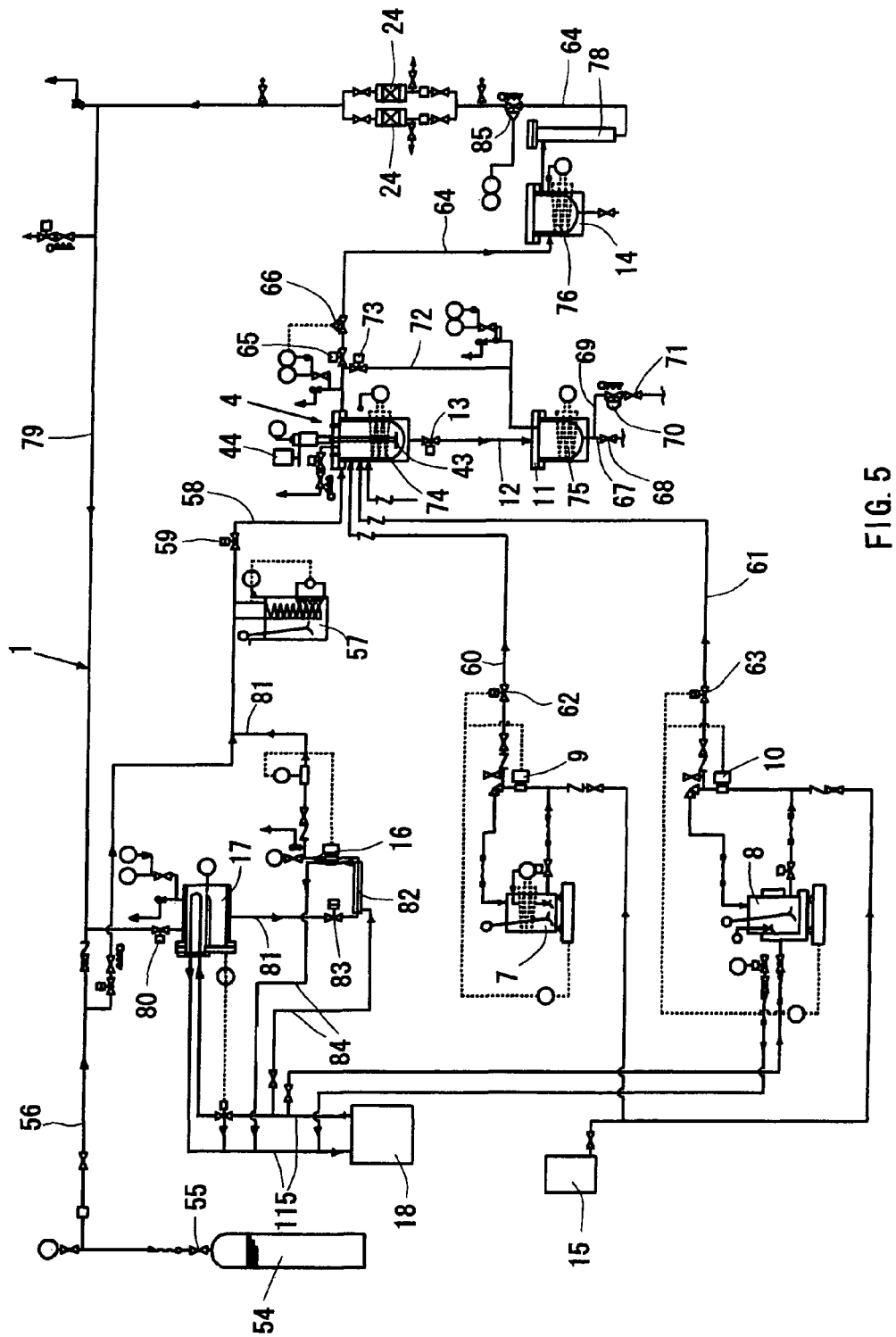
FIG. 5 is an explanatory view showing the outline of the apparatus according to the present invention.

FIG. 5 shows the outline of the apparatus of the present invention. In FIG. 5, reference numeral 54 denotes a gas cylinder which receives therein a liquefied carbon dioxide as a supercritical or subcritical fluid. The carbon dioxide can be introduced into the condensing and recovering vessel 17 via a stop valve 55 and into a heating device 57 through a cooler as later described.

The heating device 57 includes heater and an agitating device. The heating device 57 is adapted to heat the carbon dioxide up to a temperature where the carbon dioxide can be made into a supercritical or subcritical state, so that the heated carbon dioxide can be supplied into the reaction vessel 4 through a pipeline 58 and an introduction valve 59.

The reaction vessel 4 is connected with feed liquid pipelines 60, 61 which are communicated with a first and a second treatment vessel 7, 8, respectively. Feed liquid valves 62, 63 are inserted in the feed liquid pipelines 60, 61, respectively. The first and second treatment vessels 7, 8 are provided with a heater and an agitating device.

The reaction vessel 4 is connected at its upper part with a gas recovering pipe 64 which is communicated with the separation vessel 14. A gas recovering valve 65 and a pressure regulating valve 66 are inserted in the gas recovering pipe 64.

The gas recovering valve 65 is opened at the time of the degreasing and cleaning process and the drying process, and the valve 65 is closed at the time of the acid pickling process and plating process.

The pressure regulating valve 66 can regulate the pressure of the pipeline on the downstream side, i.e., treatment gas pipeline 64, of the valve 66 to a low pressure, 6 MPa in this embodiment.

On the other hand, the treatment solution recovering vessel 11 is connected at its bottom part with a discharge pipe 67 which is communicated with the outside. A discharge valve 68 is inserted in the pipe 67. The discharge pipe 67 is connected at its upstream side with a treatment solution recovering pipe 69.

The treatment solution recovering pipe 69 is communicated with the first and second treatment solution vessels 7, 8 through a refining part. A pressure regulating valve 70 and a shut-off valve 71 are inserted in the pipe 69. The pressure regulating valve 70 is adapted to regulate the pressure of the treatment solution generally to the atmospheric pressure.

One end of a bypass pipe 72 is connected to an upper part of the treatment solution recovering vessel 11, and the other end of the pipe 72 is connected to the gas recovering pipe 64 on the upstream side of the gas recovering valve 64. A shut-off valve 73 also serving as a check valve is inserted in the pipe 72.

The shut-off valve 73 is adapted to introduce the carbon dioxide separated during the treatment process of the acid pickling solution and plating solution discharged into the treatment solution recovering vessel 11 into the bypass pipe 72 so that the carbon dioxide can move into the gas recovering pipe 64.

In the illustration, reference numeral 74, 75 and 76 denote heaters which are provided on the reaction vessel 4, the treatment solution recovering vessel 11 and the separation vessel 14, respectively.

The separation vessel 14 and a reaction vessel 78 are inserted in the gas recovering pipe 64. The reaction vessel 78 is disposed on the downstream side of the separation vessel 14.

The reaction vessel 78 is composed of a generally cylindrical container. A catalyst, which includes, as its base composition, such metal as iron, chrome and aluminum, is received in this container. A treatment gas is allowed to contact the catalyst, and hydrogen and oxygen generated during the acid pickling treatment process and the plating treatment process in the reaction vessel 4 are burnt to generate water. Then, the hydrogen and oxygen are removed and the generated water is absorbed by the dewatering columns 24, 24.

One end of a return pipe 79 is connected to the downstream side of the dewatering columns 24, 24, and the other end is connected to the condensing and recovering vessel 17 through a condensing and recovering vessel inlet valve 80 so that the non-used and reproduced carbon dioxide can be cooled and liquefied.

One end of an injection pipe 81 is connected to an outlet port of the condensing and recovering vessel 17, and the other end is connected to the midstream part of the pipeline 56. A cooler 82 and the pressure pump 16 are inserted in the injection pipe 81, so that the gas-liquid mixed carbon dioxide flowed out of the condensing and recovering vessel 17 can surely be liquefied and pressurized so as to be supplied to the heating device 57.

In the illustration, 83 denotes a condensing and recovering vessel outlet valve inserted in the upstream side of the injection pipe 81, and 84 denotes a refrigerant pipeline laid on a cooler 82. The refrigerant pipeline 84 is inserted, in parallel relation, in a refrigerant pipeline 115 through which the refrigerator 18 and the condensing and recovering vessel 17 to each other. Reference numeral 85 denotes a pressure regulating valve which is inserted between the reaction vessel 78 and the dewatering column 24. This pressure regulating valve 85 is adapted to set the pressure of the pipeline on the downstream side of the valve 77 to a low pressure.

In an apparatus, thus constructed, for treating the surface of an object to be treated, the multi-process such as the prior treatment, i.e., degreasing, acid pickling treatment and drying treatment, the plating treatment, and the post plating treatment, i.e., recovering and drying treatment of the object, is carried out in only one reaction vessel 4, as later described. Accordingly, when compared with the conventional plating treatment method and equipment wherein a specific bath vessel is required for each treatment, there can be obtained such advantages; the structure can be simplified, the installation space can be made compact, and the cost of equipment can be reduced.

Moreover, since the storage vessel for temporarily storing the carbon dioxide and treatment solution after use is no more required, the equipment can be made more compact and the cost of the equipment can be more reduced to that extent. In addition, the treatment solution, etc. can be reproduced and circulated more rapidly than ever.

Moreover, in the apparatus for treating the surface of an object to be treated according to the present invention, the various discharged substances, i.e., carbon dioxide, acid pickling solution and plating solution including a surface active agent, which are discharged from such working processes as the degreasing, acid pickling, drying and plating treatment, are discharged into the treatment solution recovering vessel 11 and the separation vessel 14 in the form of gas and liquid so that they are reproduced and they are not discharged to the outside of the system. Accordingly, the conventional expensive large-sized water-discharging and gas-discharging treatment equipment is no more required.

Moreover, the acid pickling solution, the plating solution, etc. are not discharged to the outside of the system after use, and they are reproduced and used again. Accordingly, the consumption of those solutions, etc. can be minimized and the cost of plating can be reduced.

Moreover, since each treatment is carried out using a supercritical or subcritical carbon dioxide which has good dispersibility, only a very small quantity of acid pickling solution and electrolytic solution is good enough compared with the conventional plating method in which the object to be treated is dipped in a plating solution. Accordingly, a good saving can be achieved in quantity of solution to be used, the discharge treatment equipment can be miniaturized in size and scale and the productivity can be enhanced in cooperation with the above-mentioned feature.

On the other hand, in the apparatus of the present invention, a closed circuit is formed by the introduction pipe 58, the gas pipeline 64, the communication pipe 77, the return pipe 79, the injection pipe 81, etc. at the time of degreasing and cleaning process, drying process and reproducing process (including ion supply), and the carbon dioxide not yet used, as well as the one reproduced, is circulated through this closed circuit. Accordingly, the degreasing and cleaning process and the drying process, as well as the reproducing process can rationally and rapidly be carried out at a time, and thus productivity is enhanced.

Moreover, the reaction vessel 4 is, as later described, hermetically closed until the completion of the degreasing and cleaning process, the acid pickling process, the drying process and the plating process, particularly each process prior to the plating treatment, and the supercritical or subcritical fluid is circulated in order to prevent contact between the object to be plated and the atmosphere, particularly with the oxygen. Accordingly, the activating treatment on the surface of the object to be plated can surely be carried out with precision, and the ion precipitation on the surface of the object to be plated can surely be carried out.

Thus, the multi-plating on an object to be plated can surely be realized.

Moreover, in the apparatus of the present invention, a closed circuit is formed by the gas pipeline 64, the communication pipe 77, the return pipe 79, the injection pipe 81, and the carbon dioxide not yet used, as well as the one reproduced, is circulated through this closed circuit. Accordingly, the degreasing and cleaning process and the drying process, as well as the reproducing process can rationally and rapidly be carried out at a time, and thus productivity is enhanced.

Moreover, in the apparatus of the present invention, a closed circuit is formed by the first and second treatment vessels 60, 61, the pipelines 60, 61, the treatment solution discharge pipe 12, etc. at the time of acid pickling and plating process, and the acid pickling solution and plating solution not yet used, as well as the those reproduced, are supplied thereto. Accordingly, the acid pickling process and the plating process, as well as the reproducing process can rationally and rapidly be carried out at a time Thus, productivity is enhanced and effective usage of the solutions can be achieved.

On the other hand, the apparatus of the present invention needs three pressure resisting treatment vessels, 4, 11, 14. Of them, the treatment recovering vessel 11 and the separation vessel 14 are generally same in shape and size, and they are air-tight. The vessels 11, 14 include a suitable heating device.

The reaction vessel 4 includes, as shown in FIG. 6, a vessel main body 2, a lid member 6 and a clamp ring 27. The clamp ring 27 can be rotated through a suitable actuator (not shown).

The lid member 6 can be moved up and down through a suitable actuator (not shown). An agitation shaft 42 linked to the motor 44, the anode and cathode electrode rods 45, 46 and the object receiving vessel 5 are attached to the lid member 6. One end of the conductive member 47 is connected to the electrode rod 45 on the anode side, and the other end is connected to the electrode tube 48 which is mounted on the outer peripheral surface of the agitation shaft 42.

Accordingly, those components and the lid member 6 are integrally assembled, so that they can easily and rapidly be brought into and out of the chamber 36 as later described. Since they can be taken out of the reaction vessel 4, the maintenance of them, as well as the reaction vessel 4, can easily be carried out.

When the electroplating is to be carried out using the apparatus, thus constructed, for treating the surface of an object to be treated, an object to be plated is attached, either directly, or through a suitable clip, to the inner side of the framework 49 of the object treatment container 5.

Then, the peripheral edge of the upper end of the receiving container 5 is attached to the peripheral surface of the boss 37 of the lid member 6 which has been preliminarily detached from the vessel main body 25, through a bolt 39.

At that time, the agitation shaft 42 is positioned at the center of the object receiving container 5 and the electrode tube 48 is positioned at the peripheral surface of the agitation shaft 42. One end of the conductive member 47 is attached to a lower end of the electrode rod 45, and the other end is electrically connected to the electrode tube 48.

After the object to be plated is attached to the object receiving container 5 in the manner as just mentioned above, they are lifted up to a location immediately above the vessel main body 25 by an actuator and then lifted down so that the object receiving container 5, etc. are received in the chamber 36 and the lid member 6 is placed on the end part of the opening of the vessel main body 25.

The clamp ring 27 is preliminarily mounted on the outer periphery of the opening part of the vessel main body 25. Each clamp pawl 35 is fitted between every adjacent clamp pawls 34 of the ring 27.

Then, the clamp ring 27 is pushed and turned in the closing direction through an actuator (not shown) until the clamp pawls 34, 35 are engaged with each other in an up and down relation. Then, a positioning pin is inserted into the clamp ring 27 and lid member 6 to lock them.

When the object received in the reaction vessel 4 is to be degreased and cleaned under the above-mentioned circumstance, the condensing and recovering vessel inlet and outlet valves 80 and 83, the introduction valve 59, the gas recovering valve 85, the treatment solution discharge valve 13 and the shut-off valve 73 are all opened, the pressure regulating valves 66, 85 are set such that the pressure becomes stepwise low, and the stop valve 55 is opened.

As a result, the liquefied carbon dioxide filled in the gas cylinder 54 is ejected and evaporated. Such evaporated carbon dioxide is moved to the condensing and recovering vessel 17 introduced by the pipeline 54 and cooled and liquefied into a gas-liquid mixed state.

The carbon dioxide is introduced into the cooler 82 from the condensing and recovering vessel 17 via the injection pipe 81 and further cooled and totally liquefied with the cooler 82.

Such liquefied carbon dioxide is introduced into the pressure pump 16 where it is pressurized into about 10 MPa and 0.4 or more in density. The pressurized carbon dioxide is then heated to about 50 degrees C. by the heating device 57 and reaches a supercritical or subcritical state. In that state, the carbon dioxide is flowed into the reaction vessel 4 from the pipeline 58.

After flowed into the reaction vessel 4, the carbon dioxide is slightly reduced in pressure so as to allow a part of the carbon dioxide to flow into the separation vessel 14 from the reaction vessel 4 via the gas recovering pipe 64, so that the vessel 14 is increased in pressure. Then, the carbon dioxide is moved into the return pipe 79 from the vessel 14 via the reaction vessel 78 and the dewatering column 24 so that those pipelines are increased in pressure.

A part of the carbon dioxide is flowed into the treatment solution recovering vessel 11 from the reaction vessel 4 via the treatment solution discharge pipe 12 so that the vessel 11 is increased in pressure. The carbon dioxide is converged into the gas recovering pipe 64 introduced by the bypass pipe 72, so that those pipelines are increased in pressure.

Thereafter, the pressurized and heated carbon dioxide is supplied into the reaction vessel 4 from the introduction pipe 58, so that the reaction vessel 4 and the peripheral pipelines reach a supercritical state.

That is, the reaction vessel 4, the upstream side end part of the gas recovering pipe 64, the treatment solution discharge pipe 12, the treatment solution recovering vessel 11 and the bypass pipe 72 are held in the highest pressure and in the highest temperature (about 10 MPa, 50 degrees C.) in the system and placed in a supercritical state.

The gas recovering pipe 64, the separation vessel 14 and the reaction vessel 78, which are located between the pressure regulating valves 66, 85, are held in the next highest pressure and in the next highest temperature (about 6 MPa, 22 degrees C.) in the system and placed in a subcritical state. The dewatering column 24 and the return pipe 78, which are located on the downstream side of the pressure regulating valve 85, are held in the lowest pressure and in the lowest temperature and placed in a subcritical or lower state.

Under the above-mentioned circumstance, the motor 44 is driven to rotate the agitation shaft linked to the driving shaft of the motor 44 to rotate the fan 43, so that the supercritical carbon dioxide is agitated in the reaction vessel 4 and the heaters 4 through 76 of the reaction vessel 4, treatment solution recovering vessel 11 and separation vessel 14 are heated.

As a result, the supercritical carbon dioxide is dispersed while circulating in the reaction vessel 4 and contacted with the object in the vessel 4, so that the object and the oil and fat part, moisture, foreign matter, etc. adhered to the lower end part of the electrode rod 45 on the anode side, the conductive member 47, the electrode rod 48 and the lower end part of the electrode 46 on the cathode side are cleaned at a high speed and efficiently.

Moreover, since the water and solution for the conventional emulsion are no more used, the object to be plated, etc. are enhanced in drying as later described.

In the present invention, since the object 4 is degreased and cleaned with the supercritical carbon dioxide in the manner as mentioned above, the toxic degreasing agent is no more used and the working circumstance is improved compared with the conventional method in which the object is dipped in the degreasing solution. Thus, the degreasing and cleaning treatment can be carried out safely, rapidly and easily. Since the degreasing and cleaning treatment is carried out in the reaction vessel 4, the conventional specific degreasing vessel is no more required. Thus, the cost of equipment can be reduced.

The oil and fat part removed by the degreasing and cleaning treatment is conveyed by a treatment gas, i.e., supercritical or subcritical carbon dioxide which moves through the gas recovering pipe 64 and reduced in pressure and heated in the vessel 14 and then recovered.

After recovered, the treatment gas is introduced into the reaction vessel 78 and contacted with the metal catalyst contained in the reaction vessel 78, so that oxygen and hydrogen contained in the treatment gas are burnt and removed and water is generated.

Thereafter, the treatment gas is further reduced in pressure at the pressure regulating valve 85 and moved to the dewatering column 24 where the generated moisture is absorbed and the gas is reproduced. Such reproduced gas is moved toward the downstream side through the return pipe 79.

After moving to the downstream side terminal end part of the return pipe 79, the treatment gas is introduced into the condensing recovering vessel 17 where it is cooled and liquefied. Then, the treatment gas is further cooled and liquefied by the cooler 82. After totally liquefied, the treatment gas is pressurized by the pressure pump 16, then heated by the heating device 57 and received in the reaction vessel 4 where its supercritical state is recovered.

Since the degreasing and cleaning treatment is carried out by circulating the carbon dioxide in the system in the manner as described above, a degreasing and cleaning treatment can be carried out by a pure carbon dioxide compared with the case in which the degreasing and cleaning treatment is carried out by encapsulating the supercritical carbon dioxide in the reaction vessel 4. Thus, the degreasing and cleaning can be carried out with precision to that extent.

The carbon dioxide is reproduced after the degreasing and cleaning, and separation from the contaminant are carried out during the time the carbon dioxide is circulated in the system. The carbon dioxide thus reproduced is effectively utilized.

Since the carbon dioxide is not discharged to the outside of the system during the time, the exhaustion and consumption of the carbon dioxide is very small. New carbon dioxide is replenished from the gas cylinder 54 by an amount corresponding to the consumed amount.

It is also accepted that after the supercritical state is formed in the reaction vessel 4, the treatment solution discharge valve 13 is closed to carry out the degreasing and cleaning treatment.

After the degreasing and cleaning treatment is carried out for a predetermined time in the manner as mentioned above, the working operation is finished and the next acid pickling treatment is carried out.

When the acid pickling treatment is to be carried out, the hermetically closed state of the reaction vessel 4, the received state of the object receiving container 5, and the received state of the object to be plated are maintained as they are, and under that circumstance, for example, the driving of the pressure pump 16 and motor 44 is once stopped, and the condensing and recovering inlet and outlet valves 80, 81, the introduction valve 59, the treatment solution discharge valve 13 and the gas recovering valve 65, etc. are closed.

That is, the reaction vessel 4 is shut off from the peripheral pipe lines and in turn, the stop valve (not shown) of the acid pickling solution receiving tank 15 is opened and its feed liquid pump (not shown) is driven to supply the heated acid pickling solution into the reaction vessel 4.

In this case, the reaction vessel 4 is maintained in its high pressure state. However, since the acid pickling solution is larger in density than the carbon dioxide received in the reaction vessel 4, the acid pickling solution can easily be fed into the reaction vessel 4.

As in the case of the degreasing and cleaning treatment, the reaction vessel 4 is hermetically closed and maintained in its high pressure state, and the heater 74 is heated to maintain the supercritical state.

When the motor 44 is driven to agitate the acid pickling solution under the above-mentioned circumstance, the supercritical carbon dioxide is dispersed at a high speed and contacts the surface of the object to be plated to remove the oxide film from the surface of the object so that the surface of the object is activated.

In this case, application of a suitable surface active agent to the acid pickling solution for emulsion makes it possible to remove the oxide film from the surface of the object uniformly and efficiently, thereby enhancing the acid pickling efficiency.

In this way, the acid pickling treatment can be carried out rationally and efficiently by maintaining the hermetically closed state of the reaction vessel 4 and without newly supplying a carbon dioxide, by utilizing the supercritical state at the time of degreasing and cleaning treatment.

Then, after the acid pickling treatment is carried out for a predetermined time, the treatment solution discharge valve 13 and the gas recovering valve 65 is opened.

By doing so, the reaction vessel 4 is reduced in pressure, and the supercritical carbon dioxide received therein is evaporated. As a result, two layers of the carbon dioxide and acid pickling solution is formed in the reaction vessel 4.

The carbon dioxide, which is low in density, is flowed toward the gas recovering pipe 64 side, and the used acid pickling solution, which is large in density, is flowed down into the treatment solution recovering vessel 11 introduced by the treatment solution discharge pipe 12 together with the dioxide film.

In this case, since the treatment solution recovering vessel 11 is located immediately under the reaction vessel 4 and the acid pickling solution is dropped by gravity, the acid pickling solution is rapidly moved into the treatment recovering vessel 11 in cooperation with the above-mentioned ejecting speed, so that the acid pickling solution is prevented from remaining in the reaction vessel 4.

Since the treatment solution recovering vessel 11 is communicated with the gas recovering pipe 64 through the bypass pipe 72, it absorbs the flow-in pressure of the acid pickling solution for damping.

On the other hand, in the treatment solution recovering vessel 11, the heater 75 is heated almost at the same time the acid pickling solution is discharged. By this heating, the acid pickling solution and the carbon dioxide mixed in the acid pickling solution are separated, and the separated carbon dioxide is pushed out toward the bypass pipe 72 and moved into the gas recovering pipe 64.

The removed oxide film is discharged to the outside by opening the discharge valve 68. After removal of the oxide film, the acid pickling solution is sent to a refining part (not shown) by lowering the internal pressure of the pipe 64 generally to the atmospheric pressure through the pressure regulating valve 70 and by opening the shut-off valve 71. After refined, the acid pickling solution is flowed down into the acid pickling solution receiving tank 15 or into its recovering tank.

Since the oxide film of the object to be plated is removed in the supercritical state as described above, the quantity of the acid pickling solution to be used can be reduced and the acid pickling treatment can rapidly be carried out compared with the conventional acid pickling method in which the object is dipped in the acid pickling solution. Moreover, since the acid pickling treatment is carried out in the reaction vessel 4, the conventional specific acid pickling vessel is no more required and the cost of equipment can be reduced to that extent.

In case adhesion of the acid pickling solution to the reaction vessel 4, the treatment solution discharge pipe 12, the treatment solution recovering vessel 11 and the feed liquid pipes 60, 61 is not desired, the intended purpose can be achieved by providing a water tank part to the tank 15, then supplying this water into the reaction vessel 4 through the pumps 9, and the feed liquid pipes 60, 61, and then allowing the water to flow down into the treatment solution recovering vessel 11.

Since the acid pickling treatment is carried out by shutting off the reaction vessel 4 from the peripheral pipe lines, the acid pickling solution can be prevented from flowing into the system, particularly into the gas recovering pipe 64 and return pipe 79 side. Thus, corrosion caused by the acid pickling solution can be prevented.

Almost at the same time the acid pickling solution is refined and returned to the receiving tank 15, the object to be plated is dried.

In this case, the condensing and recovering inlet and outlet valves 80, 81, the gas introduction valve 59 and the gas recovering valve 65, which were closed after the degreasing and cleaning treatment, are opened, and the pressure pump 16 is driven to supply or replenish the pressurized carbon dioxide into the reaction vessel 4 so that the supercritical state is formed and maintained in the reaction vessel 4 and the carbon dioxide is circulated in the system.

By doing so, the supercritical carbon dioxide contacts the moisture adhered to the object to be plated, the electrode tube 48, the object receiving container 5, the conductive member 47, etc. and dries them by dispersing the moisture at a high speed and with precision. In this case, the moisture is carried by the carbon dioxide and removed at the dewatering column 24. Thus, the drying efficiency of carbon dioxide is maintained.

In the drying treatment, since the supercritical carbon dioxide is introduced into the reaction vessel 4 where the carbon dioxide is rapidly dispersed and discharged so as to be circulated in the system, moisture is efficiently and rapidly carried and rapidly dried.

After drying the object to be plated, the driving of the pressure pump 44 is once stopped and the condensing and recovering vessel inlet and outlet valves 80, 81, the treatment solution discharge valve 13, the gas recovering valve 65, etc. are closed. Instead, the feed liquid pumps 9, 10 of the first and second treatment vessels 7, 8 are driven to supply a predetermined plating solution to the reaction vessel 4. In this case, a suitable surface active agent is applied to the plating solution beforehand.

Under the above-mentioned circumstance, the condensing and recovering inlet and outlet valves 80, 81 and the introduction valve 59 are opened and the pressure pump 16 is driven to pressurize the carbon dioxide in the system and supply it into the reaction vessel 4 so that a supercritical state is formed and maintained in the reaction vessel 4. At that time, the introduction valve 59 is closed to shut off the reaction vessel 4 from the inside of the system. Almost simultaneous with this, when the motor 44 is driven to rotate the agitation shaft 42 so that the supercritical carbon dioxide and the plating solution are agitated.

By doing so, the supercritical carbon dioxide is dispersed into the reaction vessel 4 at a high speed, and the plating solution and the surface active agent are rapidly admixed and emulsified. The fine particles of the plating solution are dispersed into the reaction vessel 4 at high density and contact the surface of the object to be plated.

Under the above-mentioned circumstance, when a power switch (not shown), which is connected to the electrode rods 45, 46, is turned on to energize the electrode tube 48 on the anode side and the object receiving vessel 5 on the cathode side, the pure nickel ion in the plating solution is precipitated on the surface of the object to be plated.

At that time, by the rotation of the fan 43, the emulsion substance is agitated to uniformly distribute the electrolytic nickel ion and finely adhere the ion to the surface of the object to be plated.

In this case, the anode formed by the electrode tube 48 is located at the center of the inside of the reaction vessel 4, and the object receiving container 5 and the object to be plated, as a cathode, are located at the outer peripheral part of the inside of the reaction vessel 4. Accordingly, the linear electric lines of force are radially formed from the electrode tube 48 toward the object to be plated. This situation is shown in FIG. 7.

In this case, since the object receiving container 5 is located on a concentric circle of the electrode tube 48 and the object to be plated is attached to the receiving container 5, all objects to be plated are placed in the same electric potential.

Accordingly, in case the objects to be plated are same, there can be obtained a generally same electric density with respect to the objects, and there can be obtained a uniform plating state. For this reason, a uniformed plating state can be obtained compared with the conventional plating method in which a pair of electrodes are spacedly arranged in the plating vessel.

Moreover, since the reaction vessel 4 and the object receiving container 5 are circular in section and they are concentrically arranged, a plurality of objects to be plated can be equidistantly efficiently arranged. Thus, there can be obtained a mass production of the plating and the productivity is enhanced. Moreover, a good agitating effect of the plating solution and the supercritical carbon dioxide by the fan 43 can be obtained. Since a uniform in distribution is obtained, a uniform and good plating can be obtained.

Moreover, since the electrolysis, precipitation and adhesion of the electrolytic nickel ion are carried out in a supercritical state, the electrolytic nickel ion is rapidly dispersed in the reaction vessel 4 and uniformly distributed at a high density, so that the electrolytic nickel ion is adhered to the front and back surfaces of the object to be plated.

Accordingly, the so-called "throwing of plating" is very good compared with the conventional plating method in which the anode substance is electrolyzed, precipitated and adhered in the electrolytic solution. A uniform and fine plating state can be obtained on the front and back surfaces of the object to be plated, and a surface of good finishing can be obtained.

For this reason, it is no more required to take the trouble, which would otherwise be required as in the conventional plating method, to carry out the plating on the front and back surfaces of the object separately, and the productivity can be enhanced to that extent. Moreover, even in case the object has a complicated configuration, the present invention can easily cope with it without a need of an auxiliary electrode.

Since the electrode tube 48 is composed of an insoluble member and therefore, the electrode tube 48 is not eluded even if it is placed in the electrolytic solution and in the electric field, the trouble of the type, as had in the conventional method, in which the electrode is consumed and a replacement is necessary, is no more required.

Since the plating treatment is carried out by shutting off the reaction vessel 4 from the peripheral pipe lines, the plating solution can be prevented from flowing into the system, particularly into the gas recovering pipe 64 and return pipe 79 side. Thus, corrosion caused by the plating solution can be prevented.

After the above-mentioned plating process is finished, an electrode incurring switch is turned off to stop the fan 43, and the treatment solution discharge valve 13, the gas recovering valve 65, the introduction valve 59, and the condensing and recovering vessel inlet and outlet valves 80, 83 are opened.

By doing so, the inside of the reaction vessel 4 is reduced in pressure, and the supercritical carbon dioxide is reduced in pressure and abruptly evaporated or liquefied. The evaporated or liquefied carbon dioxide forms a two-layers state together with the plating solution or surface active agent.

The carbon dioxide, which is low in density, is pushed out into the gas recovering pipe 64, and the plating solution or surface active agent, which is large in density, is pushed out into the treatment solution discharge pipe 12 and flowed down into the treatment solution recovering vessel 11.

Almost simultaneous with the discharge of the plating solution, in the treatment solution recovering vessel 11, the heater 75 is heated. By this heating of the heater 75, the plating solution and the carbon dioxide mixed therein are separated from each other, and the carbon dioxide thus separated is pushed out into the bypass pipe 72 and moved to the gas recovering pipe 64.

The plating solution or surface active agent is reduced in pressure generally to the atmospheric pressure through the pressure regulating valve 70 and moved to the refining part (not shown) where it is refined and then allowed to flow down into the first or second treatment vessel 7, 8.

In this embodiment, the used plating solution and surface active agent are returned to the original first or second treatment vessel 7, 8 so as to be re-used.

After being subjected to plating treatment, the object to be plated, etc. are dried.

In this case, the driving of the pressure pump 16 is continued to supply or replenish the supercritical carbon dioxide into the reaction vessel 4, so that the supercritical carbon dioxide contacts the plating solution, etc. adhered to the object receiving container 5, the conductive member 47, etc. After dispersing this at a high speed, the carbon dioxide is pushed out into the gas recovering pipe 64.

In the drying treatment, since the supercritical carbon dioxide is introduced into the reaction vessel 4 where the carbon dioxide is rapidly dispersed and discharged so as to be circulated in the system, moisture is efficiently and rapidly carried and rapidly dried. In this case, the moisture carried by the carbon dioxide is removed at the dewatering column 24, and the drying efficiency is maintained.

After being dried, the object to be plated is taken out of the reaction vessel 4. In this case, the pressure pump 16 and the motor 44 are stopped, and the introduction valve 59, the gas recovering valve 65 and the treatment solution discharge valve 13 is opened.

Then, the positioning pin (not shown) is removed and the clamp ring 27 is rotated in the opening direction through the actuator so that the clamp pawl 34 of the ring 27 is disengaged from the clamp ring 35 of the lid member 6. This situation is shown in FIG. 8.

Figure 3:
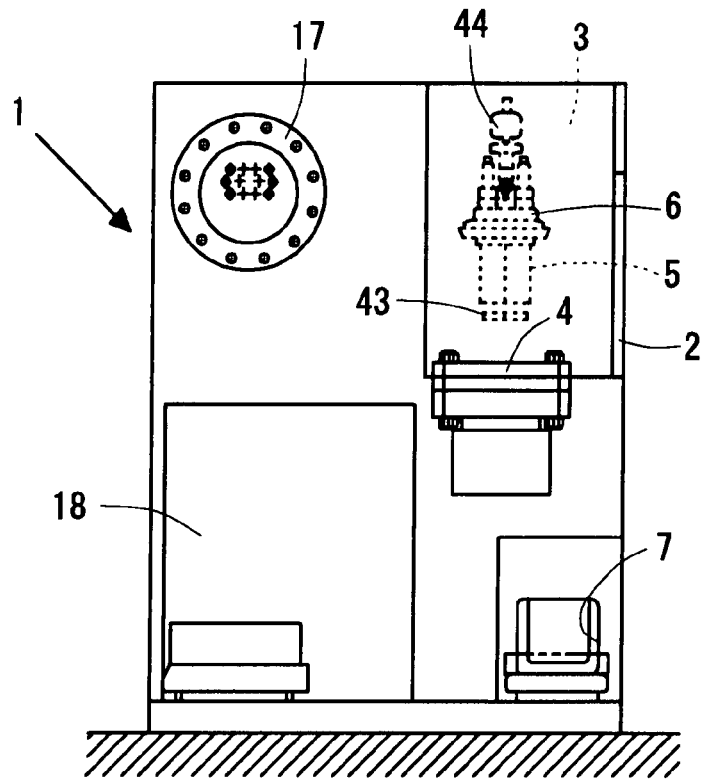
FIG. 3 is a left side view of FIG. 1 showing a state of the interior of the apparatus according to the present invention.
Figure 4:
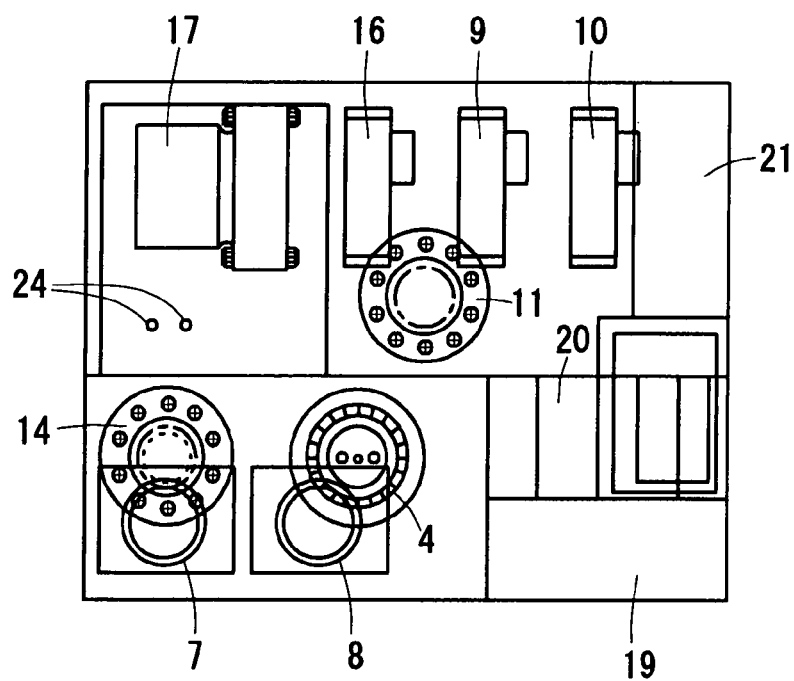
FIG. 4 is a plan view of FIG. 1 showing a state of the interior of the apparatus according to the present invention.

Thereafter, the lid member 6 is lifted up through the actuator, and the object receiving container 5, the object to be plated, the electrode rods 45, 46, the agitation shaft 42, the electrode tube 48, the conductive member 47, etc. are taken out of the reaction vessel 4 as one group. This situation is shown in FIG. 3.

Thereafter, the bolt 39 is removed, the object receiving container 5 is detached from the lid member 6, and the object received in the container 5 is removed. By doing so, a series of plating operation is finished.

In the above-mentioned embodiment, although a supercritical or subcritical fluid is used as a medium for the cleaning and degreasing treatment, the electrochemical reaction treatment and the drying treatment, the present invention is not limited to this. Instead, a pressurized gas of the atmospheric pressure or higher, for example, carbon dioxide may be used. By doing so, the pressure-resisting treatment vessels 4, 11, 14, the pressure-resisting pipe lines, the heating and pressurizing means, etc. which are required for forming the supercritical or subcritical state, are not needed. Thus, the invention can be manufactured at a low cost, and the operation can be carried out easily and safely.

In the above-mentioned embodiment, although the series of processes are carried out in only one reaction vessel 4, it is also accepted that a plurality of such reaction vessels 4 are employed so that each process is carried out in each reaction vessel independently, and the supercritical or subcritical carbon dioxide, acid solution, plating solution, surface active agent, etc. which are used in the reaction vessel in the preceding process are supplied into the reaction vessel in the following process so that the carbon dioxide, etc. can be utilized effectively and the electrochemical treatment can be carried out on a mass production basis.

In case the object is to be subjected to multi-layer treatment, i.e., lap plating treatment, the above-mentioned individual processes may be carried out repeatedly and sequentially.

Accordingly, there is no more required to take such trouble as in the conventional lap plating in which the object to be plated is taken out of the reaction vessel every time the plating treatment is finished and moved to the vessel for the following process. Thus, the productivity is enhanced to that extent. In addition, consumption of the carbon dioxide, etc. caused by releasing thereof can be prevented.

Moreover, since there is no such worry, as had conventionally, for contact of the object to be plated with the atmosphere at the time of taking out the object from the reaction vessel, the activating treatment on the surface of the object can be maintained surely and safely. This is very advantageous for the lap plating.

Figure 10:
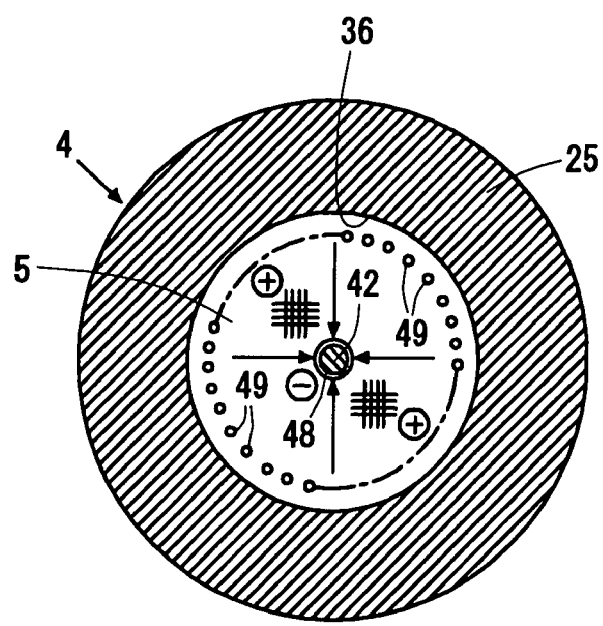
FIG. 10 is a sectional view showing an essential part according to the second embodiment of the present invention, showing an energization state in which the polarities of the jig and electrodes in the reaction vessel are changed.

FIG. 10 shows the second embodiment of the present invention. In this second embodiment, the polarity of the electrode rods 45, 45 is realized by simple switching over operation of the rectifier 20.

Even if the polarity of the electrode rods 45, 46 is changed in this way, no metal ion is released from the electrode tube 48. Since it only functions for the formation of the electric field between the electrode rods 45, 46 and the object receiving container 5, there is no interference for their electrochemical reaction. By merely allowing the selection and change of the polarity, rational use and operation can be obtained.

Moreover, at that time, the electric lines of force are radially formed from the inside of the object receiving container 5 toward the electrode tube 48, and the same function and effect as in the case mentioned above can be obtained.

Figure 11:
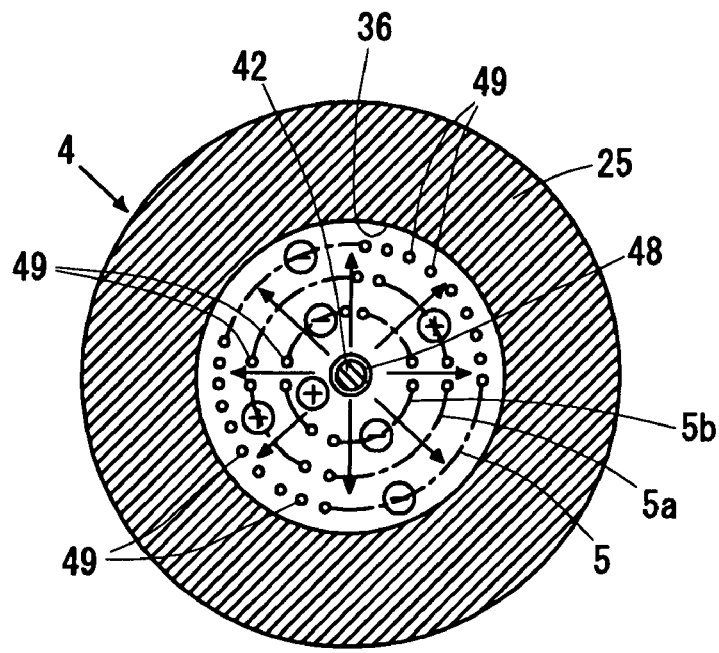
FIG. 11 is a sectional view showing an essential part of the third embodiment of the present invention, showing an energization state in which a plurality of jigs are concentrically arranged around the electrodes in the reaction vessel.

FIG. 11 shows the third embodiment of the present invention. In this third embodiment, a plurality of object receiving containers 5, 5a, 5b having a mutually similar figure are employed. Those containers 5, 5a, 5b are concentrically and equidistantly arranged about the electrode tube 48. The same electric potential is incurred to the adjacent electrode tube 48 and the object receiving containers 5, 5a and one pair of object receiving containers 5, 5b, so that the plating treatment can be carried out on a mass production basis by the object receiving containers 5, 5a, 5b arranged in the chamber 36 and the construction can be simplified.

In this case, although the object receiving containers 5, 5a, 5b are concentrically arranged, the invention is likewise be applicable to the conventional plating method in which both of them are arranged in parallel in opposing relation and also to a reaction vessel having a generally rectangular configuration in section.

Figure 12:
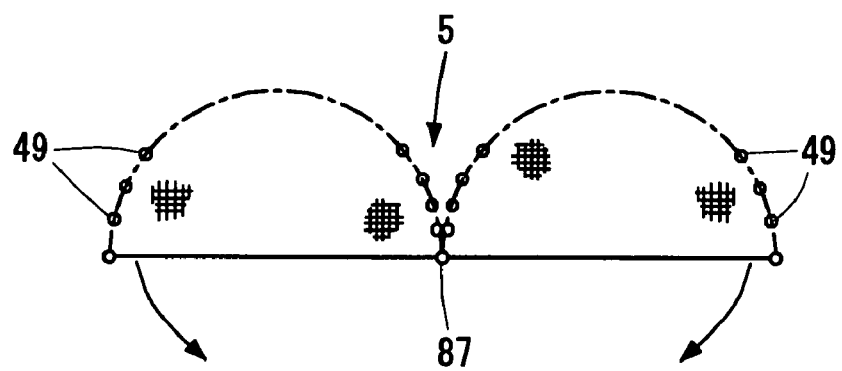
FIG. 12 is a plan view showing an essential part of the fourth embodiment of the present invention, showing a state of a jig which is split into two parts.

FIG. 12 shows the fourth embodiment of the present invention. In this fourth embodiment, the object receiving container 5 is formed such that it can vertically be split into two parts. The basal end parts of those two parts are rotatably connected to each other through a hinge, and the other end parts are connected to each other through a suitable clip or the like. Owing to this arrangement, the object to be plated can be carried in and out from the container 5 in a convenient manner.

The method for precipitating and adhering an electrolyzed substance to the other electrolytic substance as in the above-mentioned embodiment can be applied to an electroforming method and an anode oxide film forming method which are same in principle as the present one, and the same effect as mentioned above can be obtained.

Similarly, the present invention can also be applied to an electrolytic method in which an electrolytic substance and an electrode substance are received in a reaction vessel and the electrode substance is electrolyzed and collected by the other electrode substance side. By doing so, the present invention can be applied to, for example, a metal electrorefining, electroextraction, electropolishing, etc., and the same effect as mentioned above can be obtained.

Moreover, the present invention can also be applied to an electroless plating method and a chemical conversion treatment method, in which an object to be treated is received in a reaction vessel which can receive therein an electrolytic substance, the electrolytic substance contained in an electrolytic solution is precipitated and adhered to the object and no external electric field is applied thereto. By doing so, the same effect as mentioned above can be obtained.

Figure 13:
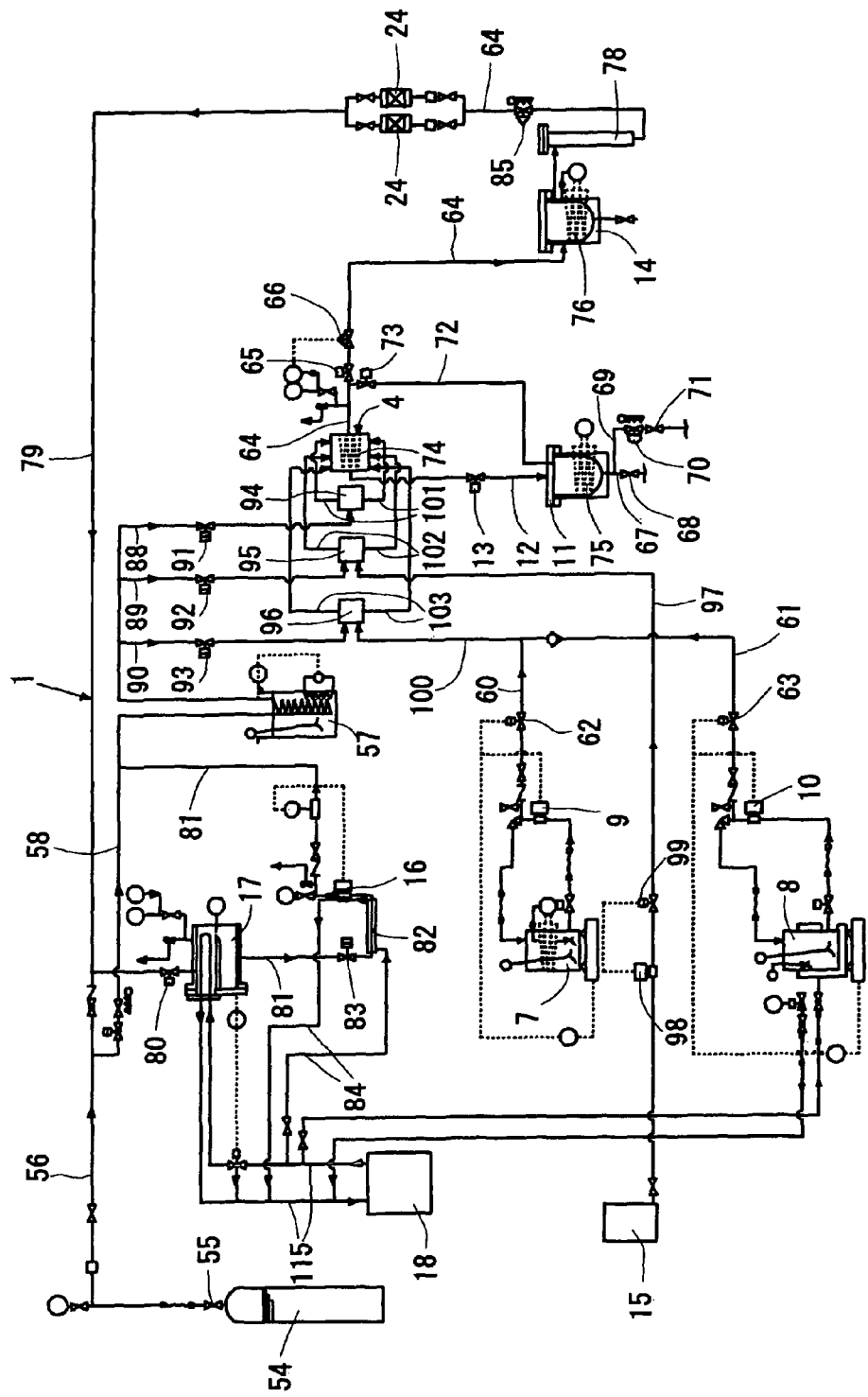
FIG. 13 is an explanatory view showing the outline of the apparatus according to the fifth embodiment of the present invention.
Figure 14:
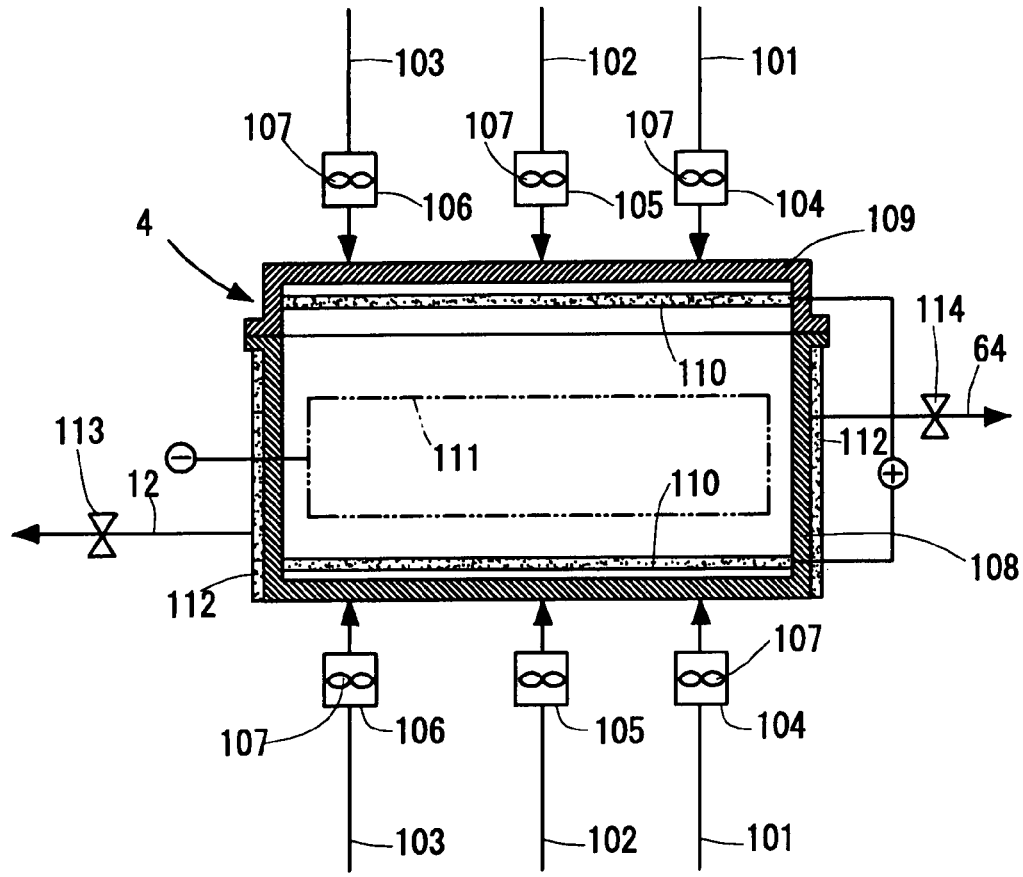
FIG. 14 is a vertical sectional view showing, on an enlarged scale, a reaction vessel which is applied to the fifth embodiment of the present invention.
Figure 15:
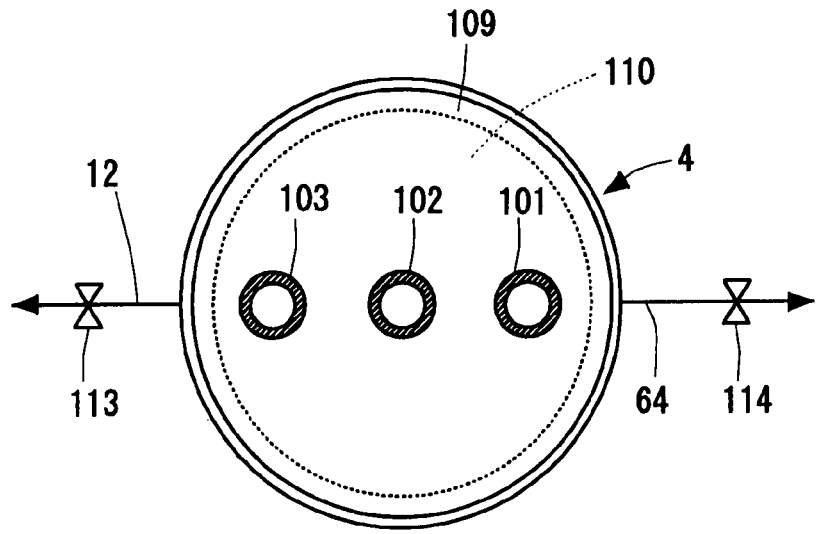
FIG. 15 is a plan view of the reaction vessel which is applied to the fifth embodiment of the present invention.

FIGS. 13 through 15 show the fifth embodiment of the present invention. In this fifth embodiment, the present invention is applied to an electroplating (nickel plating) as an electrochemical treatment method utilizing a supercritical or subcritical fluid.

That is, a treatment apparatus 1 installed in a working chamber includes a gas cylinder which receives therein a liquefied carbon dioxide as a supercritical or subcritical state forming fluid which is a component of the composition. The carbon dioxide can be introduced into the heating device 57 through the stop valve 55, the conduit 56, the condensing and recovering vessel 17 and a cooler as later described.

The heating device 57 includes a heater and an agitation device. The carbon dioxide is heated by this heating device 57 to a temperature capable of forming a supercritical or subcritical state, and the heated carbon dioxide is introduced into a flow dividing pipes 88 through 90 which are communicated with the conduit 56.

The flow dividing pipes 88 through 90 are connected to the chambers 94 through 96, through control valves 91 through 93, respectively, so that the supercritical or subcritical carbon dioxide can be introduced into the chambers 94 through 96.

The control valves 91 through 93 are normally closed. When and how long the valves 91 through 93 should be open are programmed. The control valve 91 is opened immediately before the degreasing and cleaning treatment process, the control valve 92 is opened immediately before the acid pickling treatment process, and the control valve 93 is opened immediately before the plating treatment process.

The chambers 94 through 96 are formed into a pressure-resisting dispersing chamber or agitating chamber. Only the carbon dioxide, which is in the above-mentioned state, is introduced into the chamber 94. A conduit 97, which is communicated with the acid pickling solution receiving tank 15, is connected to the chamber 95.

A liquid feed pump 98 and a liquid feed valve 99 are inserted in the conduit 97, so that the carbon dioxide, which is in the above-mentioned state, and the acid pickling solution can be introduced therein simultaneously.

A conduit 100, which is communicated with the first and second treatment solution vessels 7, 7 which receive therein different electrolytic solutions, is connected to the chamber 96, so that the carbon dioxide, which is in the above-mentioned state, and a predetermined electrolytic solution can be introduced therein simultaneously.

One pair each of ejection pipes 101 through 103 are connected to the chambers 94 through 96, respectively, and the other ends thereof are connected to the upper and lower positions of the reaction vessel 4. Agitating chambers 104 through 106 are inserted in the other end side of the ejection pipes 101 through 103. A suitable agitator 107 such as a fan is installed at the inside of each of the agitating chambers 104 through 106, so that the same or different kinds of surface treatment fluids introduced into the chambers can be dispersed or agitated and then ejected generally in same quantity and at a same speed.

The reaction vessel 4 is composed of a pressure-resisting container which is small in size and light in weight. The reaction vessel 4 comprises a bottomed cylindrical vessel main body 108 and its lid member 109. The main body 108 and the lid member 109 are mounted such that they are air-tight and open and closable at their joining parts.

In this embodiment, the reaction vessel 4 is formed in a cylindrical member having an outside diameter of about 30 cm, and portable.

One pair of disc-like electrodes (carbon or platinum-made anodes 110 in this embodiment) are attached to the inner surfaces of the vessel main body 108 and lid member 109 in such a manner as to be vertically opposed to each other. At the time of electroplating, a predetermined positive voltage can be incurred to those electrodes 110. The anode 110 on the upper side can be handled together with the lid member 109.

The anodes 110 are formed in a porous member, or a porous-shape or a net shape, so that the dispersion or agitation fluid ejected from the ejection pipes 101 through 102 can be transmitted therethrough.

In the illustration, reference numeral 111 denotes an object to be treated which forms a cathode which is placed in the anodes 110, 110 and which is attached to a suitable jig (not shown), and reference numeral 112 denotes a heater wound on the peripheral surface of the reaction vessel 4.

One pair of outlet pipes 12, 64 are connected to the side peripheral surface of the reaction vessel 4. The outlet pipe 12 is connected to the pressure-resisting treatment solution recovering vessel 11 as a separation vessel 14, and the other outlet pipe 64 is connected to the separation vessel 14.

The treatment solution recovering vessel 11 is disposed below the reaction vessel 4. The heater 75 is wound on the peripheral surface of the vessel 11. The treatment solution in the reaction vessel 4 is flowed down by gravity action after treatment and received in the vessel 11. The treatment solution received in the vessel 11 is heated by the heater 75, so that carbon dioxide and the treatment solution can be separated.

The treatment solution recovering pipe 69 is communicated with the first and second treatment solution vessels 7, 8 through a refining part. The pressure regulating valve 70 and a shut-off valve 71 are inserted in the pipe 69. The pressure of the treatment solution can be regulated generally to the atmospheric pressure by the pressure regulating vale 70. In the illustration, reference numeral 113, 114 denote stop valves which are inserted in the basal end parts of the outlet pipes 12, 64, respectively.

In the reaction vessel 4 of the surface treatment apparatus thus constructed, since the degreasing and cleaning solution and acid pickling solution, the electrolytic solution, etc. are not agitated therein as later described, an agitating space and an agitator in the vessel can be omitted. Thus, the reaction vessel 4 can be made small in size and light in weight to that extend and its construction can be simplified. Thus, the reaction vessel 4 can be manufactured easily and at a low cost.

When the electroplating is to be carried out using the surface treatment apparatus of this embodiment, the object 111 is attached, either directly or through a suitable clip, to a jig (not shown) and received in the vessel main body 108. Then, the lid member 109 is attached air-tight to the vessel main body 108. Under this circumstance, the object 111 is degreased and cleaned first.

In this case, the condensing and recovering vessel inlet and outlet valve 80, the control valve 91, the gas recovering valve 65, the treatment solution discharge valve 102 and the shut-off valve 73 are all opened, the pressure regulating valve 85 is set such that the pressure becomes stepwise low, and the stop valve 55 is opened.

By doing so, the liquefied carbon dioxide filled in the gas cylinder 54 is flowed out and evaporated. Such evaporated carbon dioxide is moved to the condensing and recovering vessel 17 introduced by the conduit 56 where it is cooled and liquefied into a gas-liquid dispersed or agitated state. The carbon dioxide is introduced into the cooler 82 from the condensing and recovering vessel 17 via the injection pipe 81 and further cooled and totally liquefied with the cooler 82.

Thereafter, such liquefied carbon dioxide is introduced into the pressure pump 16 where it is pressurized into about 10 MPa and 0.4 or more in density. The pressurized carbon dioxide is then heated to about 50 degrees C. by the heating device 57 and reaches a supercritical or subcritical state. In that state, the carbon dioxide is flowed into the chamber 98 from the conduit 58 guided by the flow dividing pipe 88.

The supercritical or subcritical carbon dioxide is made even and stabilized in the chamber 94, and then separated into the ejection pipes 101, 101 so as to be introduced into the agitating chambers 104, 104. Then, the carbon dioxide is agitated at the agitators 107, 107 and flowed into the reaction chamber 4.

That is, the carbon dioxide, which is in the above-mentioned state, is ejected from the upper and lower parts of the reaction vessel 4 generally in same quantity and at the same speed. Then, the carbon dioxide is vigorously collided against the proximal anodes 110, 110 and atomized or agitated. After passing through the anodes 110, 110, the carbon dioxide is contacted with the upper and lower parts of the object 111 so that the oil and part portion, moisture, foreign matter adhered to the object 111 are cleaned at a high speed and with precision.

Since the degreasing and cleaning treatment is carried out by simultaneously ejecting the supercritical or subcritical carbon dioxide from the upper and lower parts of the object 111, the front and back surfaces of the object 111 can be degreased and cleaned at a time, with precision and rapidly.

Moreover, since the degreasing and cleaning treatment is carried out with respect to the object 111 by using the supercritical or subcritical carbon dioxide, use of the toxic degreasing agent is no more required and the working circumstance is improved compared with the conventional method in which the object is dipped in a degreasing solution. Thus, the degreasing and cleaning treatment can be carried out safely, rapidly and easily. Since the degreasing and cleaning treatment is carried out in the reaction vessel 4, no specific degreasing vessel is required unlike the conventional method. Therefore, the equipment cost can be reduced to that extent.

On the other hand, a part of the carbon dioxide is flowed into the treatment solution recovering vessel 11 from the reaction vessel 4 via the outlet pipe 12 as the degreasing and cleaning treatment progresses. The carbon dioxide flowed into the treatment solution recovering vessel 11 raises the pressure of the vessel 11 and then, it is flowed out into the outlet pipe 64 introduced by the bypass pipe 72.

The oil and fat, etc. removed by the degreasing and cleaning treatment is introduced into the separation vessel 14 from the reaction vessel 4 via the outlet pipe 64 together with the carbon dioxide which is the treatment gas. In the vessel 14, the carbon dioxide is reduced in pressure, heated and recovered.

After recovered, the gas component in the treatment gas is introduced into the reaction vessel 78 where it is contacted with the metal catalyst so that the oxide and hydrogen are burnt and removed therefrom. As a result, water is generated in the vessel 78.

Thereafter, the treatment gas is further reduced in pressure at the pressure regulating valve 85 and moved to the dewatering column 24 where the generated moisture is absorbed and the gas is reproduced. Such reproduced gas is moved toward the downstream side through the return pipe 79.

The reproduced gas is introduced from the downstream side terminal end part of the return pipe 79 into the condensing and recovering vessel 17 where it is cooled and liquefied. Then, the treatment gas is further cooled and liquefied by the cooler 82. After totally liquefied, the treatment gas is pressurized by the pressure pump 16, then heated by the heating device 57 and moved into the flow dividing pipe 88. Then, the treatment gas is introduced into the reaction vessel 4 from the chamber 94 via the ejection pipes 101, 101.

Since the degreasing and cleaning treatment is carried out by circulating the carbon dioxide in the system in the manner as described above, a degreasing and cleaning treatment can be carried out by a pure carbon dioxide compared with the case in which the degreasing and cleaning treatment is carried out by encapsulating the supercritical carbon dioxide in the reaction vessel 4. Thus, the degreasing and cleaning can be carried out with precision to that extent.

The carbon dioxide is reproduced during the time the carbon dioxide is circulated in the system. The carbon dioxide thus reproduced is effectively utilized. Since the carbon dioxide is not discharged to the outside of the system during the time, the exhaustion and consumption of the carbon dioxide is very small. New carbon dioxide is replenished from the gas cylinder 54 by an amount corresponding to the consumed amount.

It is also accepted that after the supercritical state is formed in the reaction vessel 4, the treatment solution discharge valve 13 is closed to carry out the degreasing and cleaning treatment.

After the degreasing and cleaning treatment is carried out for a predetermined time in the manner as mentioned above, the working operation is finished and the next acid pickling treatment is carried out. When the acid pickling treatment is to be carried out, the hermetically closed state of the reaction vessel 4 and the received state of the object 111 are maintained as they are, and under that circumstance, the treatment solution discharge valve 13 and the gas recovering valve 65, etc. are closed.

Then, the control valve 91 is closed. Instead, the control valve 92 is opened, and the stop valve of the acid pickling solution receiving tank 15 is opened. The liquid feed pump 98 is driven and the heated acid pickling solution is regulated to a predetermined pressure by the pressure regulating valve 99 and introduced into the chamber 95 through the conduit 97.

By doing so, the supercritical or subcritical carbon dioxide is introduced into the chamber 95 through the flow dividing pipe 89, and the acid pickling solution is flowed into the chamber 95 introduced by the conduit 97. The carbon dioxide and acid pickling solution are then dispersed or agitated and introduced into agitating chambers 105, 105 from the ejection pipes 102, 102. After being agitated in the agitating vessels 107, 107, they are flowed into the reaction vessel 4.

That is, the dispersed or agitated fluid of the carbon dioxide and acid pickling solution, which are in the above-mentioned states, is ejected from the upper and lower parts of the reaction vessel 4 generally in same quantity and at the same speed. Then, the carbon dioxide, etc. are vigorously collided against the proximal anodes 110, 110 and atomized or agitated. After passing through the anodes 110, 110, the carbon dioxide, etc. are contacted with the object 111 so that the front and back surfaces of the object 111 are acid pickled at a high speed and with precision, and the oxide film on the surface of the object 111 is removed to activate the surface.

In this case, application of a suitable surface active agent to the acid pickling solution for emulsion makes it possible to remove the oxide film from the surface of the object uniformly and efficiently, thereby enhancing the acid pickling efficiency.

Then, after the acid pickling treatment is carried out for a predetermined time, the treatment solution discharge valve 102 and the gas recovering valve 65 is opened. By doing so, the reaction vessel 4 is reduced in pressure, and the supercritical carbon dioxide received therein is evaporated. As a result, two layers of the carbon dioxide and acid pickling solution is formed in the reaction vessel 4.

The carbon dioxide, which is low in density, is flowed toward the outlet pipe 64 side, and the used acid pickling solution, which is large in density, is flowed down into the treatment solution recovering vessel 11 introduced by the outlet pipe 12 together with the oxide film.

In this case, since the treatment solution recovering vessel 11 is located immediately under the reaction vessel 4 and the acid pickling solution is dropped by gravity, the acid pickling solution is rapidly moved into the treatment recovering vessel 11 in cooperation with the above-mentioned ejecting speed, so that the acid pickling solution is prevented from remaining in the reaction vessel 4.

Since the treatment solution recovering vessel 11 is communicated with the outlet pipe 64 through the bypass pipe 72, it absorbs the flow-in pressure of the acid pickling solution for damping.

On the other hand, in the treatment solution recovering vessel 11, the heater 75 is heated almost at the same time the acid pickling solution is discharged. By this heating, the acid pickling solution and the carbon dioxide mixed in the acid pickling solution are separated, and the separated carbon dioxide is pushed out toward the bypass pipe 72 and moved into the outlet pipe 64.

The removed oxide film is discharged to the outside by opening the discharge valve 68. After removal of the oxide film, the acid pickling solution is sent to a refining part (not shown) by lowering the internal pressure of the treatment solution recovering pipe 69 generally to the atmospheric pressure and by opening the shut-off valve 71. After refined, the acid pickling solution is flowed down into the acid pickling solution receiving tank 15 or into its recovering tank.

In this embodiment, since the supercritical or subcritical carbon dioxide and the acid pickling solution are dispersed or agitated and then simultaneously ejected from the upper and lower parts of the object 111, the front and back surfaces of the object 111 can be subjected to acid pickling treatment at a time with precision and rapidly.

Since the oxide film of the object to be plated is removed in the supercritical state, the quantity of the acid pickling solution to be used can be reduced and the acid pickling treatment can rapidly be carried out compared with the conventional acid pickling method in which the object is dipped in the acid pickling solution. Moreover, since the acid pickling treatment is carried out in the reaction vessel 4, the conventional specific acid pickling vessel is no more required and the cost of equipment can be reduced to that extent.

Since the acid pickling treatment is carried out by shutting off the reaction vessel 4 from the peripheral pipe lines, the acid pickling solution can be prevented from flowing into the system, particularly into the outlet pipe 64 and return pipe 79 side.

Almost at the same time the acid pickling solution is refined and returned to the receiving tank 15, the object to be treated is dried.

In this case, the gas recovering valve 65, which was closed after the degreasing and cleaning treatment, are opened, and the pressurized carbon dioxide is supplied into the reaction vessel 4 so that the supercritical or subcritical state is formed and maintained in the reaction vessel 4 and the carbon dioxide is circulated in the system.

By doing so, the supercritical or subcritical carbon dioxide is ejected from the upper and lower parts of the object 111 to contact the moisture adhered to the front and back surfaces of the object 111, and dries them by dispersing the moisture at a high speed and with precision.

In this case, the moisture is carried by the carbon dioxide and removed at the dewatering column 24. Thus, drying of the carbon dioxide is enhanced.

In the drying treatment, since the supercritical or subcritical carbon dioxide is introduced into the reaction vessel 4 where the carbon dioxide is rapidly dispersed and discharged so as to be circulated in the system, moisture is efficiently and rapidly carried and rapidly dried compared with the case in which the carbon dioxide is dried by shutting off the reaction vessel 4 from the inside of the system.

After drying the object 111, the control valve 92 is closed. Instead, the control valve 93 is opened. Then, the treatment solution discharge valve 13, the gas recovering valve 65, etc.

are opened so that the supercritical or subcritical carbon dioxide is introduced into the chamber 96 through the flow dividing pipe 90.

Moreover, the feed liquid pumps 9, 10 of the first and second treatment vessels 7, 8 are driven to supply a predetermined electrolytic solution into the chamber 96 through the conduit 100.

In this case, a suitable surface active agent is preferably applied to the electrolytic solution beforehand.

The supercritical or subcritical carbon dioxide, electrolytic solution and surface active agent are dispersed or agitated in the chamber 96 and emulsified. Then, they are introduced into the agitating chambers 106, 106 from the ejection pipes 103, 103 and agitated in the agitation vessels 107, 107 so as to be sent into the reaction vessel 4.

That is, the dispersed or agitated fluid of the emulsified carbon dioxide, electrolytic solution and surface active agent is ejected from the upper and lower parts of the reaction vessel 4 generally in same quantity and at the same speed. Then, the fluid is vigorously collided against the proximal anodes 110, 110 and atomized or agitated. After passing through the anodes 110, 110, the fluid is contacted with the object 111 with precision and uniformly.

When the emulsified state of the supercritical or subcritical fluid is maintained in the reaction vessel 4, the control valve 93 is closed to shut off the reaction vessel 4 from the inside of the system.

Under the above-mentioned circumstance, the anode 110 and the cathode, i.e., object 111 are energized so that the pure nickel ion in the electrolytic solution is precipitated on the surface of the object 111.

In this case, since the reaction vessel 4 is small in size as mentioned previously, the electric field is uniformly distributed. Moreover, through the pair of ejection pipes 103 and the pair of anodes 110, a good agitating effect can be obtained among the electrolytic solution, the supercritical carbon dioxide and the surface active agent, and a uniform ion distribution and ion supply can be obtained. Thus, the metal ion is uniformly precipitated on the cathode, i.e., object 111, and therefore, a uniform and good plating can be obtained.

Moreover, since the reaction vessel 4 is circular in section and the disc-like anodes 110, 110 are concentrically arranged therein, a plurality of objects 111 can be efficiently arranged. Thus, there can be obtained a mass production of the plating and the productivity is enhanced.

Moreover, since the electrolysis, precipitation and adhesion of the electrolytic nickel ion are carried out in a supercritical state, the electrolytic nickel ion is rapidly dispersed in the reaction vessel 4 and uniformly distributed at a high density, so that the electrolytic nickel ion is adhered to the front and back surfaces of the object 111.

Accordingly, the so-called "throwing of plating" is very good compared with the conventional plating method in which the anode substance is electrolyzed, precipitated and adhered in the electrolytic solution. A uniform and fine plating state can be obtained on the front and back surfaces of the object 38, and a surface of good finishing can be obtained.

For this reason, it is no more required to take the trouble, which would otherwise be required as in the conventional plating method, to carry out the plating on the front and back surfaces of the object separately, and the productivity can be enhanced to that extent. Moreover, even in case the object 111 has a complicated configuration, the present invention can easily cope with it without a need of an auxiliary electrode.

Since the plating treatment is carried out by shutting off the reaction vessel 4 from the peripheral pipe lines, the electrolytic solution can be prevented from flowing into the system, particularly into the outlet pipe 64 and return pipe 79 side. Thus, corrosion caused by the plating solution can be prevented.

After the above-mentioned plating process is finished, an electrode switch is turned off to open the treatment solution discharge valve 13, the gas recovering valve 65 and the control valve 93 are opened.

By doing so, the inside of the reaction vessel 4 is reduced in pressure, and the supercritical or subcritical carbon dioxide is reduced in pressure and abruptly evaporated or liquefied. The evaporated or liquefied carbon dioxide forms a two-layers state together with the electrolytic solution or surface active agent.

The carbon dioxide, which is small in density, is pushed out into the outlet pipe 64, and the electrolytic solution or surface active agent, which is large in density, is pushed out into the outlet pipe 12 and flowed down into the treatment solution recovering vessel 11.

Almost simultaneous with the discharge of the electrolytic solution, in the treatment solution recovering vessel 11, the heater 75 is heated. By this heating of the heater 75, the electrolytic solution and the carbon dioxide mixed therein are separated from each other, and the carbon dioxide thus separated is pushed out into the bypass pipe 72 and moved to the outlet pipe 64.

The electrolytic solution or surface active agent is reduced in pressure generally to the atmospheric pressure through the pressure regulating valve 70 and moved to the refining part (not shown) where it is refined and then allowed to return into the first or second treatment vessel 7, 8 so that it can be utilized again. After plating, the object 111, etc. are dried.

In this case, the driving of the pressure pump 16 is continued to supply or replenish the supercritical or subcritical carbon dioxide into the reaction vessel 4, so that the supercritical or subcritical carbon dioxide contacts the electrolytic solution adhered to the object 111 and the jig, etc. After dispersing at a high speed, the carbon dioxide is pushed out into the outlet pipe 64.

In the drying treatment, since the supercritical or subcritical carbon dioxide is introduced into the reaction vessel 4 from its upper and lower parts and rapidly dispersed and discharged so as to be circulated in the system, moisture is efficiently carried and rapidly dried. In this case, the moisture carried by the carbon dioxide is removed at the dewatering column 24 to facilitate its drying. After being dried, the object 111 is taken out of the reaction vessel 4. By doing so, a sequence of the plating operation is finished.

In the above embodiment, although the surface treatment fluid is simultaneously ejected to both sides of the object 111, it may be ejected to one side of the object 111. Although, the transmission member 110 is arranged on the both sides of the object 111, it may be arranged on one side. By doing so, the number of component parts can be reduced and the construction can be simplified. Moreover, the reaction vessel 4 can be made small in size and light in weight.

In the above-mentioned embodiment, although a supercritical or subcritical fluid is used as a medium for the cleaning and degreasing treatment, the electrochemical reaction treatment and the drying treatment, the present invention is not limited to this. Instead, a pressurized gas of the atmospheric pressure or higher, for example, carbon dioxide may be used. By doing so, the pressure-resisting treatment vessels 4, 11, 14, the pressure-resisting pipe lines, the heating and pressurizing means, etc. which are required for forming the supercritical or subcritical state, are not needed. Thus, the invention can be manufactured at a low cost, and the operation can be carried out easily and safely.

In the above-mentioned embodiment, although the series of processes are carried out in only one reaction vessel 4, it is also accepted that a plurality of such reaction vessels 4 are employed so that each process is carried out in each reaction vessel independently, and the supercritical or subcritical carbon dioxide, acid solution, electrolytic solution, surface active agent, etc. which are used in the reaction vessel 4 in the preceding process are supplied into the reaction vessel 4 in the following process after the preceding process is finished so that the supercritical or subcritical carbon dioxide, etc. can be utilized effectively and the electrochemical treatment can be carried out on a mass production basis.

In case the object is to be subjected to multi-layer treatment, i.e., lap plating treatment, the above-mentioned individual processes may be carried out repeatedly and sequentially.

Accordingly, there is no more required to take such trouble as in the conventional lap plating in which the object is taken out of the reaction vessel every time the plating treatment is finished and moved to the vessel for the following process. Thus, the productivity is enhanced to that extent. In addition, consumption of the carbon dioxide, etc. caused by releasing thereof can be prevented.

Moreover, since there is no such worry, as had conventionally, for contact of the object with the atmosphere at the time of taking out the object from the reaction vessel, the activating treatment on the surface of the object can be maintained surely and safely. This is very advantageous for the lap plating.

In the above-mentioned embodiment, although the agitating chambers 104 through 106 are installed in each pair of the ejection pipes 101 through 103, they can be omitted. By doing so, the construction can be simplified and the invention can be manufactured at a low cost. Moreover, by properly selecting the material, shape and dimension of the anodes 110, 110, and regulating the ejecting pressure, the agitating effect of the anodes 110, 110 can be increased so that the same effect as the agitating chambers 104 through 106 can be obtained.

INDUSTRIAL APPLICABILITY

As apparent from the description made hereinbefore, a method for treating the surface of an object to be treated and an apparatus thereof according to the present invention, is capable of avoiding contact between the object and the atmosphere, uniformly activating the surface of the object with precision, obtaining a good precipitation of metal ion, rationally carrying out the supply and discharge of the surface treatment fluid and the treatment solution, attaining effective utilization thereof and prohibiting the discharge of the same to the outside of the system, realizing a reasonable system, enhancing productivity and achieving mass production, rationally and safely carrying out the electrochemical treatment operation, miniaturizing the equipment and achieving the cost reduction, and providing a convenient maintenance, and suitably applied, for example, to electrochemical treatment on an object to be treated.

The invention claimed is:

1. An apparatus for treating a surface of an object to be treated, comprising:
   a vessel main body receiving therein a jig to the interior of which said object can be attached and an agitator, and capable of supplying/discharging said surface treatment fluid of said object; and
   a lid member capable of hermetically closing said main body, wherein
   only one or a plurality of said jigs are detachably attached to said lid member,
   a cross-sectional configuration of a chamber of said vessel main body and a cross-sectional configuration of said jig have a mutually similar shape,
   said chamber and jig are arranged concentrically, and
   said jig is partitioned into plural partitioned sections, and said partitioned sections are rotatably connected together.

2. An apparatus for treating a surface of an object to be treated, comprising:
   a vessel main body having a chamber for receiving a container to which the object to be treated is attachable;
   a reaction vessel having a lid member adapted to hermetically close an opening of the vessel main body, a surface treatment fluid being suppliable to the chamber, the container being detachably attached to the lid member, and the container and the lid member being integrally connected when taken out from the chamber;
   a plurality of first clamp pawls protruding from a peripheral surface of the lid member;
   a clamp seal part having a reduced diameter formed on a peripheral surface of an upper part of the vessel main body;
   a plurality of second clamp pawls protruding from a peripheral surface of a middle part of the clamp seal part;
   a clamp ring rotatably and disengageably attached to a peripheral surface of a junction between the lid member and the vessel main body, an inner surface of the clamp ring being rotatably attachable to the clamp seal part;
   at least two annular grooves provided with an upper position and a lower position of a middle part of the inner surface of the clamp ring and being engageable with the first and second clamp pawls; and
   a plurality of third clamp pawls protruding from an upper position and a lower position of the inner surface of the clamp ring, the third clamp pawls being engageable with the first and second clamp pawls.

3. An apparatus according to claim 2, wherein supercritical or subcritical carbon dioxide for degreasing cleaning the object, supercritical or subcritical carbon dioxide and an acid pickling solution and a surface active agent for acid pickling the object, or supercritical or subcritical carbon dioxide and an electrolytic solution and a surface active agent are selectively supplied to or discharged from the chamber.

4. An apparatus according to claim 2, further comprising a plurality of electrodes attached to the lid member, wherein the electrodes, the lid member, and the container are integrally movable.

5. An apparatus according to claim 4, wherein the chamber and the container are arranged concentrically, and one of the electrodes is arranged at a center thereof.

6. An apparatus according to claim 5, wherein a plurality of relatively smaller and larger-sized containers having a circular cross section are concentrically arranged about the electrode.

7. An apparatus according to claim 2, wherein:
   the container is formed such that the container is vertically split into two parts;
   basal end parts of said two parts are rotatably connected to each other; and
   other end parts are connected to each other by a clip.

* * * * *